(12) United States Patent
Chang et al.

(10) Patent No.: US 11,605,639 B2
(45) Date of Patent: Mar. 14, 2023

(54) ONE-TIME-PROGRAMMABLE MEMORY DEVICE INCLUDING AN ANTIFUSE STRUCTURE AND METHODS OF FORMING THE SAME

(71) Applicant: Taiwan Semiconductor Manufacturing Company Limited, Hsinchu (TW)

(72) Inventors: Meng-Sheng Chang, Chu-bei (TW); Chia-En Huang, Xinfeng Township (TW); Yih Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 86 days.

(21) Appl. No.: 16/901,038

(22) Filed: Jun. 15, 2020

(65) Prior Publication Data
US 2021/0391342 A1 Dec. 16, 2021

(51) Int. Cl.
*H01L 27/112* (2006.01)
*H01L 23/525* (2006.01)

(52) U.S. Cl.
CPC .... *H01L 27/11206* (2013.01); *H01L 23/5252* (2013.01)

(58) Field of Classification Search
CPC .......... H01L 27/11206; H01L 23/5252
See application file for complete search history.

(56) References Cited

U.S. PATENT DOCUMENTS

| | | | | |
|---|---|---|---|---|
| 5,134,457 A | * | 7/1992 | Hamdy | H01L 23/5252 257/530 |
| 5,565,702 A | * | 10/1996 | Tamura | H01L 23/5252 257/50 |
| 9,589,970 B1 | * | 3/2017 | Tseng | H01L 29/0653 |
| 2006/0221698 A1 | * | 10/2006 | Obuchi | H01L 27/11206 257/E21.666 |
| 2008/0019165 A1 | * | 1/2008 | Lin | H01L 27/112 257/E29.345 |
| 2012/0176226 A1 | * | 7/2012 | Mackenzie | G08B 13/2437 29/25.42 |
| 2014/0054712 A1 | * | 2/2014 | Jung | H01L 23/5252 257/368 |
| 2017/0301681 A1 | * | 10/2017 | Denorme | G11C 11/005 |
| 2020/0212054 A1 | * | 7/2020 | Lee | H01L 27/11206 |

\* cited by examiner

*Primary Examiner* — Aaron J Gray

(74) *Attorney, Agent, or Firm* — The Marbury Law Group, PLLC

(57) ABSTRACT

A one time programmable memory device includes a field effect transistor and an antifuse structure. A first node of the antifuse structure includes, or is electrically connected to, the drain region of the field effect transistor. The antifuse structure includes an antifuse dielectric layer and a second node on, or over, the antifuse dielectric layer. One of the first node and the second node includes the drain region or a metal via structure formed within a via cavity extending through an interlayer dielectric material layer that overlies the field effect transistor.

20 Claims, 32 Drawing Sheets

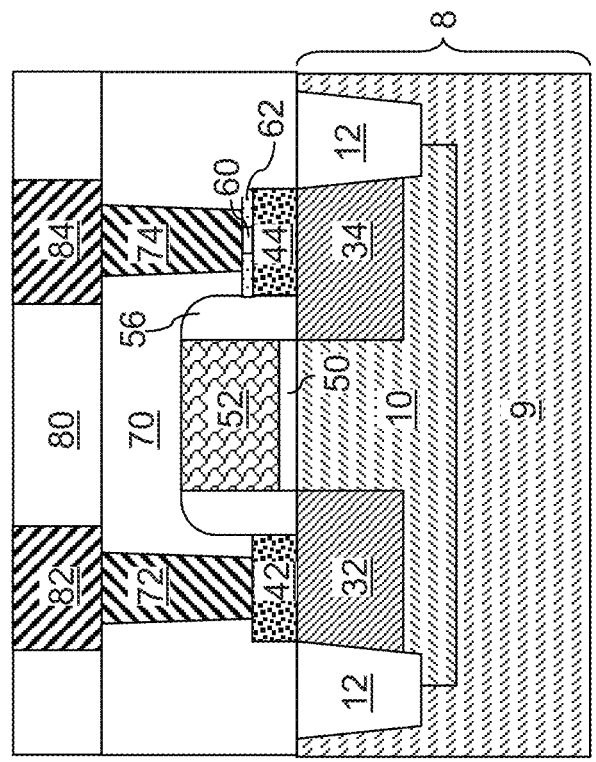
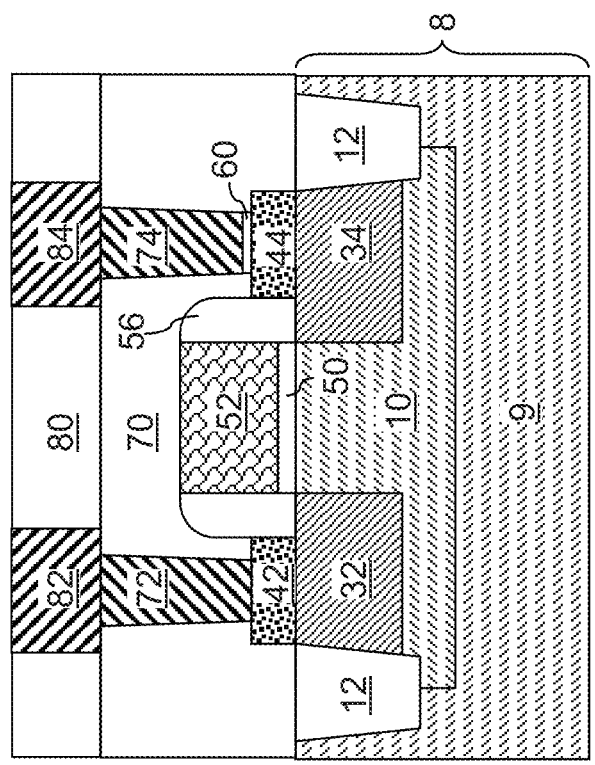
FIG. 2F
FIG. 2E

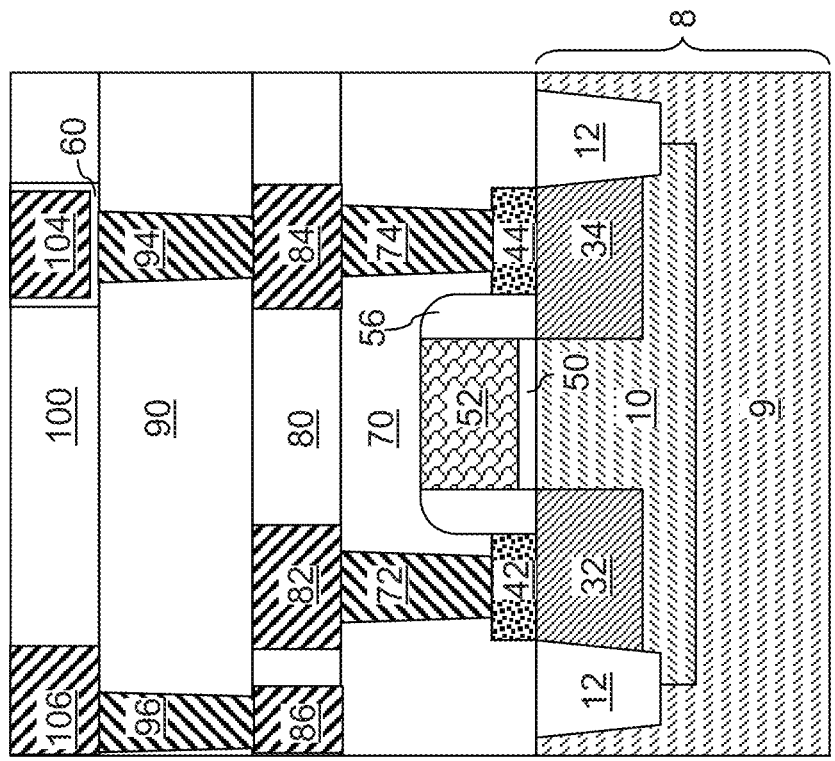
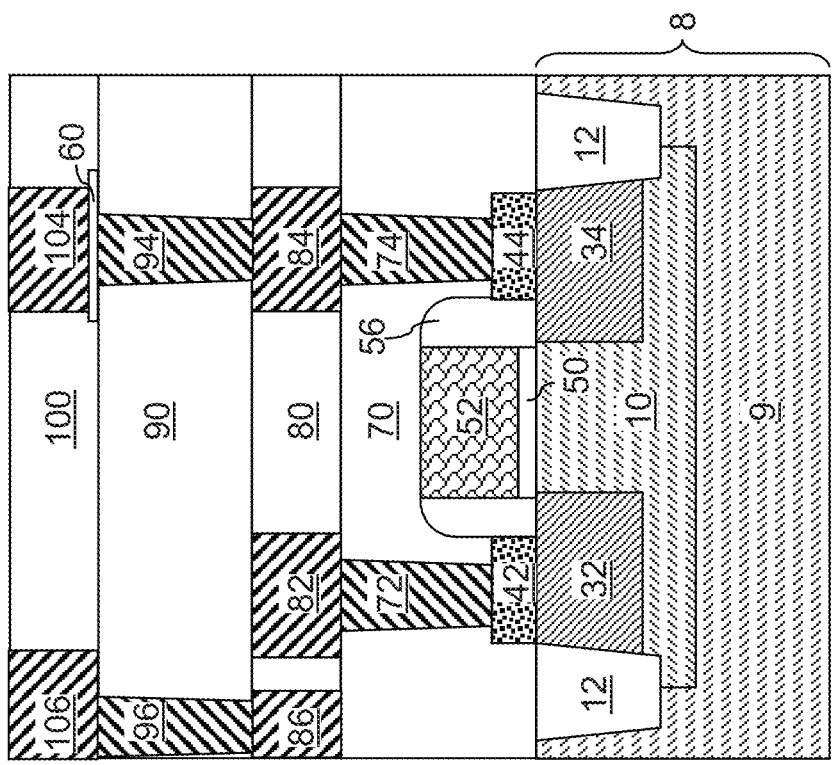
FIG. 5A
FIG. 5B

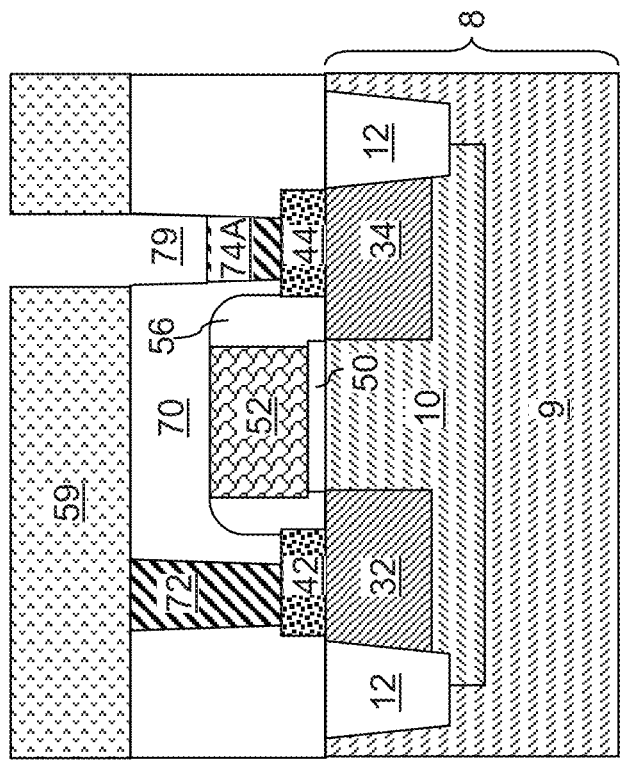
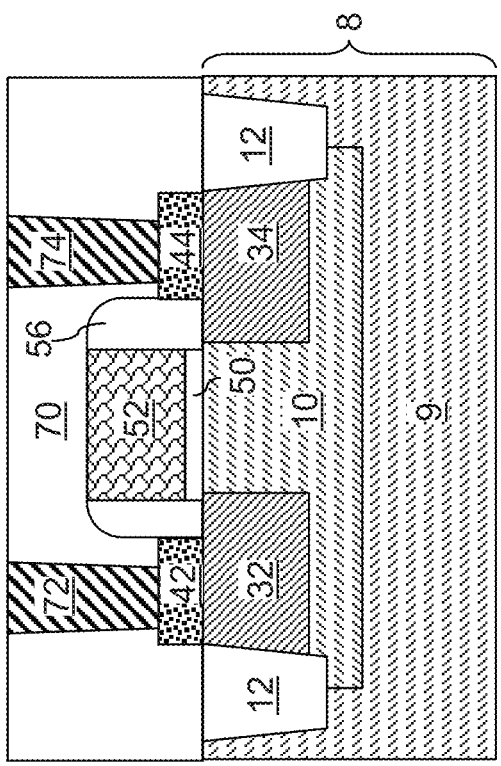
FIG. 9B
FIG. 9A

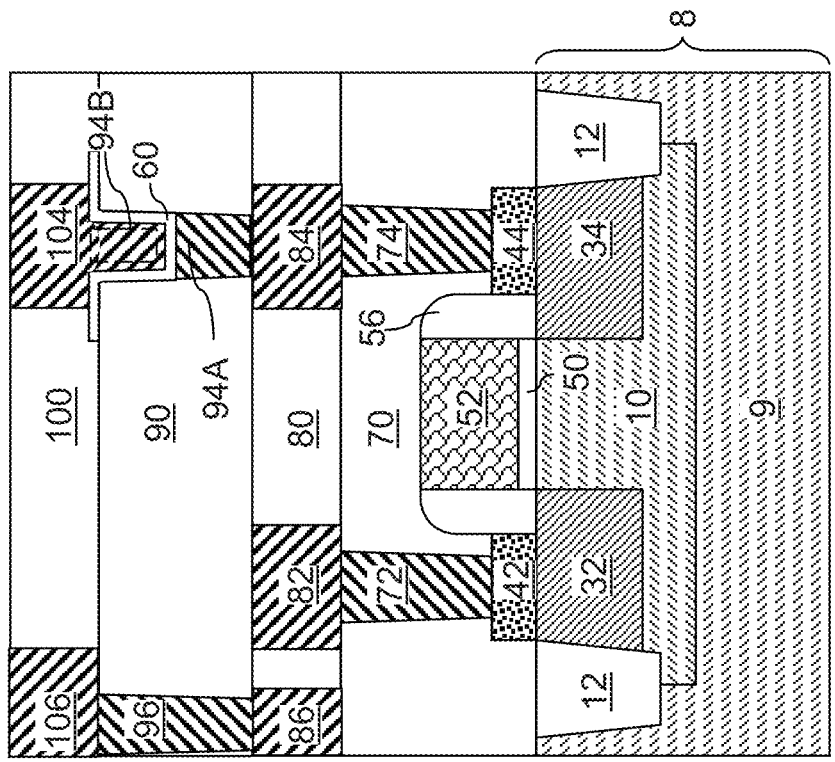
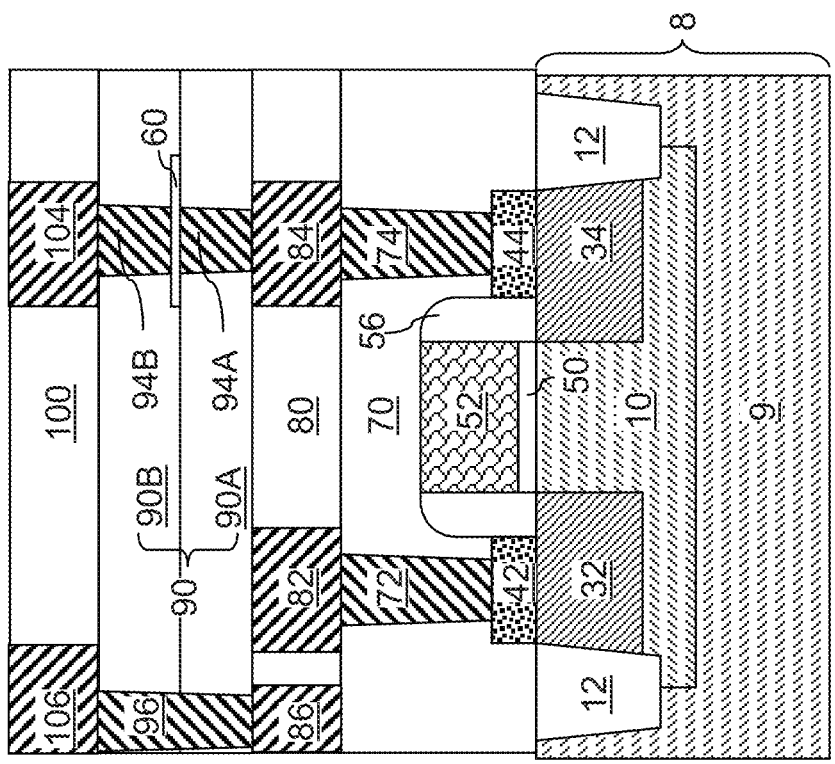
FIG. 10A
FIG. 10B

ONE-TIME-PROGRAMMABLE MEMORY DEVICE INCLUDING AN ANTIFUSE STRUCTURE AND METHODS OF FORMING THE SAME

BACKGROUND

An one-time-programmable (OTP) memory device is a memory device that may be programmed once for permanent storage of key information in a semiconductor device. OTP memory devices include electrical fuses and electrical antifuses. Electrical fuses provide reduced device resistance upon programming. Electrical antifuses provide increased device resistance upon programming.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2E is a vertical cross-sectional view of a second alternative embodiment of the second exemplary structure according to the second embodiment of the present disclosure.

FIG. 2F is a vertical cross-sectional view of a second alternative embodiment of the second exemplary structure according to the second embodiment of the present disclosure.

FIGS. 5A and 5B are vertical cross-sectional views of various embodiments of a fifth exemplary structure including an OTP memory device according to a fifth embodiment of the present disclosure.

FIGS. 9A-9D are sequential vertical cross-sectional views of a ninth exemplary structure during formation of an OTP memory device according to a ninth embodiment of the present disclosure.

FIGS. 10A and 10B are vertical cross-sectional views of various embodiments of a tenth exemplary structure including an OTP memory device according to a tenth embodiment of the present disclosure.

DETAILED DESCRIPTION

Figure 1A:
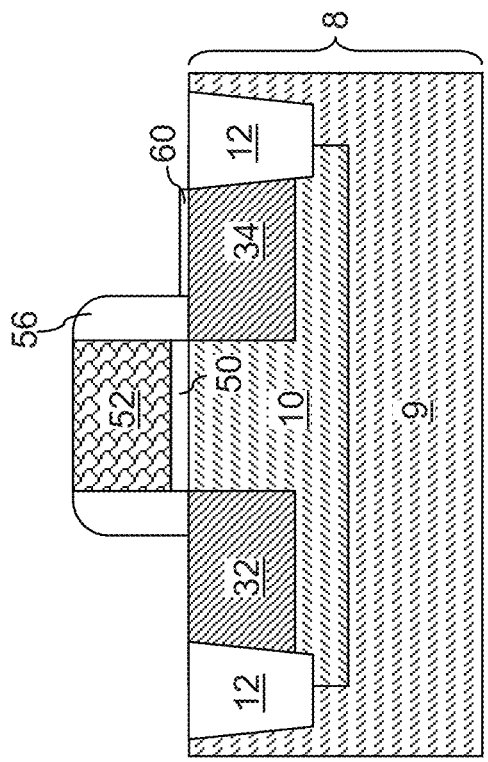
FIGS. 1A-1D are sequential vertical cross-sectional views during formation of a first exemplary structure of a one time programmable (OTP) memory device according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed generally to semiconductor devices, and specifically to an one time programmable (OTP) memory device including an antifuse structure and methods of forming the same. The present disclosure is directed generally to semiconductor devices including semiconductor-on-insulator (SOI) field effect transistors located on a same SOI substrate and having different thicknesses for body regions and methods of forming the same. A top semiconductor layer of an SOI substrate may be patterned into multiple body regions that are laterally surrounded by a shallow trench isolation structure. The different body regions may be selectively thinned using a combination of patterned oxidation mask structures and oxidation processes that oxide upper portions of unmasked body regions, or using a combination of patterned etch mask structures and etch processes that etch upper portions of unmasked body regions. The various embodiments of which are discussed in detail herebelow.

Generally, an antifuse structure includes a first node and a second node that can conduct electricity, and an antifuse dielectric layer located between the first node and the second node. If the antifuse dielectric layer is in an intact structure without any rupture therethrough, the antifuse structure is in a high resistance state, or in an "unprogrammed state." If the antifuse dielectric layer is ruptured or disturbed due to the application of a high voltage bias between the first node and the second node, a conductive material of the first node or the second node fills the rupture or disturbance to provide a conductive path through the ruptured or disturbed antifuse dielectric layer. In this case, the antifuse structure is in a low resistance state, or in a "programmed stated".

FIGS. 1A-1D are sequential vertical cross-sectional views during formation of a first exemplary structure of a one time programmable (OTP) memory device according to a first embodiment of the present disclosure. Referring to FIG. 1A, a first exemplary structure for forming a one time programmable (OTP) memory device according to a first embodiment of the present disclosure is illustrated. The first exemplary structure includes a substrate 8, which includes a substrate semiconductor layer 9. The substrate semiconductor layer 9 includes a semiconductor material such as single crystalline silicon.

A transistor including a source region 32, a drain region 34, a gate dielectric 50, and a gate electrode 52 may be formed on the substrate 8. The source region 32 and the drain region 34 may be formed within the substrate semiconductor layer 9, or may be formed in a semiconductor material portion 10 such as a doped well that is formed within the substrate semiconductor layer 9. A dielectric gate spacer 56 may laterally surround the gate electrode 52 and/or may contact a top surface of the substrate 8. A shallow trench isolation structure 12 may be formed in the substrate 8, and may laterally surround the area of the field effect transistor.

In an illustrative example, the semiconductor material region 10 may have a first conductivity type (such as p-type or n-type), and the substrate semiconductor layer 9 may have a doping of the first conductivity type or a second conductivity type that is the opposite of the first conductivity type. Alternatively, a triple well configuration may be used, in which the semiconductor material portion 10 is a doped well having a doping of the first conductivity type and may be formed in another doped well (not shown) having a doping of the second conductivity type and formed in the substrate semiconductor layer 9, which may have a doping of the first conductivity type. Generally, a first p-n junction is formed between the source region 32 and the semiconductor material portion 10, and a second p-n junction is formed between the drain region 34 and the semiconductor material portion 10. As such, the semiconductor material portion 10 includes a body region of the field effect transistor.

Figure 1B:
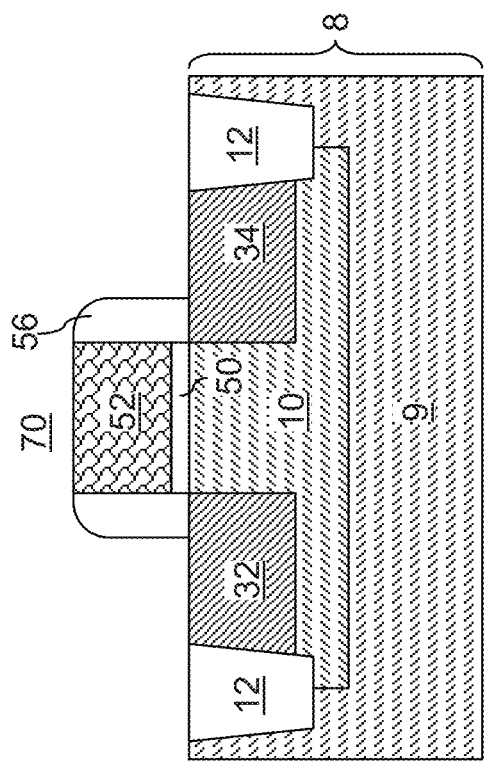

Referring to FIG. 1B, an antifuse dielectric layer 60 may be formed by deposition of a dielectric material layer over the drain region 34 and over the gate stack (50, 52), by applying and patterning a photoresist layer over the dielectric material layer, and by transferring the pattern in the photoresist layer through the dielectric material layer. The photoresist layer may be subsequently removed, for example, by ashing. A remaining portion of the dielectric material layer includes the antifuse dielectric layer 60. The lateral extent of the antifuse dielectric layer 60 may cover all of the physically exposed top surface of the drain region 34, or may cover only a portion of the physically exposed top surface of the drain region 34. In an alternative embodiment, patterning of the dielectric material layer into the antifuse dielectric layer 60 may be performed at a subsequently processing step during patterning of the drain-side metallic material portion.

According to an embodiment of the present disclosure, the drain region 34 may constitute a first node of a one time programmable (OTP) memory device, and an antifuse dielectric layer 60 may be formed directly on a top surface of the drain region 34. The antifuse dielectric layer 60 operates as an inter-electrode dielectric that may function as an insulating structure until a threshold voltage (which is a minimum programming voltage) is applied thereacross. The antifuse dielectric layer 60 operates as a resistive material portion after a dielectric breakdown that occurs when the voltage applied thereacross exceeds the threshold voltage. Thus, the antifuse dielectric layer 60 includes a material that may have a dielectric breakdown upon application of a programming voltage during a programming step.

The antifuse dielectric layer 60 may include a dielectric material such as silicon oxide, silicon oxynitride, silicon nitride, silicon carbide nitride, a dielectric metal oxide, or a stack or a combination thereof. Other suitable dielectric materials for the antifuse dielectric layer 60 are within the contemplated scope of disclosure. In one embodiment, the antifuse dielectric layer 60 may include a dielectric material different from the dielectric material of the gate dielectric 50. In one embodiment, the antifuse dielectric layer 60 may include a metal oxide dielectric material that includes oxide vacancies such as titanium oxide to facilitate dielectric breakdown during programming. In another embodiment, the antifuse dielectric layer 60 may include silicon oxide. The thickness of the antifuse dielectric layer 60 may be in a range from 1 nm to 10 nm, such as from 2 nm to 4 nm, although lesser and greater thicknesses may also be used.

Figure 1D:
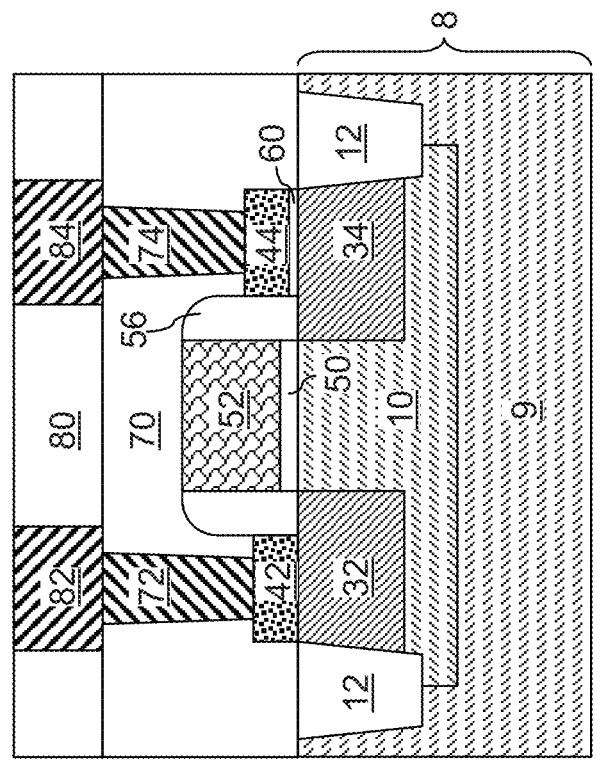
Figure 1C:
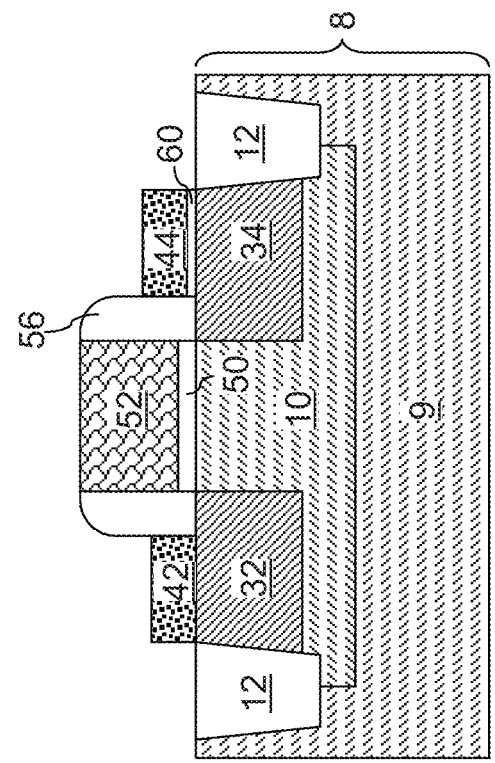

Referring to FIG. 1C, metallic material portions (42, 44) may be deposited on the source region 32 and the antifuse dielectric layer 60 (which is in turn formed on the drain region 34). For example, a metallic material layer may be deposited over the entirety of the first exemplary structure, and a photoresist layer (not shown) may be applied and patterned over the metallic material layer to form discrete patterned photoresist material portions overlying the source region 32 and/or the antifuse dielectric layer 60. An etch process (such as a reactive ion etch process) may be performed to remove unmasked portions of the metallic material layer. A portion of the metallic material layer that remains on the source region 32 comprises the source-side metallic material portion 42, and a portion of the metallic material layer that remains on the antifuse dielectric layer 60 comprises the drain-side metallic material portion 44. The photoresist material portions may be subsequently removed, for example, by ashing.

Alternatively, a patterned photoresist layer (not shown) including openings in areas of the source region 32 and the antifuse dielectric layer 60 may be formed over the first exemplary structure, and a metallic material may be anisotropically deposited, for example, by physical vapor deposition (PVD). A portion of the metallic material that may be deposited on the source region 32 comprises the source-side metallic material portion 42, and a portion of the metallic material that may be deposited on the antifuse dielectric layer 60 comprises the drain-side metallic material portion 44. The photoresist layer and portions of the metallic material deposited over the photoresist layer may be removed, for example, by a liftoff process.

In one embodiment, the source-side metallic material portion 42 and the drain-side metallic material portion 44 may include a diffusion barrier metallic material that may block diffusion of metal into a semiconductor material. For example, the source-side metallic material portion 42 and the drain-side metallic material portion 44 may include at least one conductive metallic nitride material such as TiN, TaN, WN, TiC, TaC, and/or WC. Other suitable metallic materials are within the contemplated scope of disclosure.

Alternatively, the source-side metallic material portion 42 and the drain-side metallic material portion 44 may include a metal-semiconductor alloy such as a metal silicide (such as titanium silicide, tungsten silicide, cobalt silicide, nickel silicide, platinum silicide, etc.), a metal germanide, and/or a metal germanosilicide. In this embodiment, the material of the source-side metallic material portion 42 and the drain-side metallic material portion 44 may be deposited as the metal-semiconductor alloy, or may be deposited in a layer stack of at least one semiconductor layer and at least one metal layer, and may be subsequently converted into the metal-semiconductor alloy by performing an anneal process.

The drain-side metallic material portion 44 may function as a second node of an antifuse structure. In this embodiment, the antifuse structure (34, 60, 44) includes a first node comprising the drain region 34, an antifuse dielectric layer 60, and a second node comprising the drain-side metallic material portion 44. In one embodiment, the source-side metallic material portion 42 and the drain-side metallic material portion 44 may have the same material composition and the same thickness, which may be in a range from 2 nm to 60 nm, such as from 5 nm to 30 nm, although lesser and greater thicknesses may also be used. In another embodiment, the source-side metallic material portion 42 and the drain-side metallic material portion 44 may have different material compositions.

In one embodiment, the antifuse dielectric layer 60 has a lateral extent that is greater than, or the same as, the lateral extent of the drain-side metallic material portion 44. The antifuse dielectric layer 60 may laterally extend from an outer sidewall of the dielectric gate spacer 56 at least to an edge of a top surface of a shallow trench isolation structure 12. In one embodiment, the patterning of the drain-side metallic material portion 44 and the antifuse dielectric layer 60 may be performed using a same patterning mask (such as a patterned photoresist layer) after deposition of the metallic material of the drain-side metallic material portion 44. In this embodiment, the drain-side metallic material portion 44 and the antifuse dielectric layer 60 may have the same lateral extent. A periphery of the top surface of the antifuse dielectric layer 60 may coincide with a periphery of the bottom surface of the drain-side metallic material portion 44.

Referring to FIG. 1D, an interlayer dielectric (ILD) material layer may be deposited over the gate stack (50, 52), the source-side metallic material portion 42, and the drain-side metallic material portion 44. An ILD material layer refers to any dielectric material layer that has formed therein any metal interconnect structure, which may be a metal via structure, a metal line structure, or an integrated line and via structure. The ILD material layer that is deposited over the gate stack (50, 52), the source-side metallic material portion 42, and the drain-side metallic material portion 44 is herein referred to as a contact-level dielectric layer 70. The contact-level dielectric layer 70 may include a dielectric material such as undoped silicate glass, a doped silicate glass, organosilicate glass, silicon carbide nitride, or other ILD dielectric material known in the art.

The contact-level dielectric layer 70 may be deposited by chemical vapor deposition (CVD) or by spin coating. The top surface of the contact-level dielectric layer 70 may be formed as a planar horizontal surface (in embodiments in which a spin coating is used to deposit the contact-level dielectric layer 70), or may be planarized by a planarization process such as a chemical mechanical planarization (CMP) process. The top surface of the contact-level dielectric layer 70 may be formed above the horizontal plane including the top surface of the gate electrode 52. The thickness of the contact-level dielectric layer 70 may be in a range from 200 nm to 600 nm, although lesser and greater thicknesses may also be used.

A photoresist layer (not shown) may be applied over the contact-level dielectric layer 70, and may be lithographically patterned to form openings in areas that overlie the source-side metallic material portion 42, the drain-side metallic material portion 44, or the gate stack (50, 52). An anisotropic etch process may be performed to form via cavities in areas that underlie the openings in the photoresist layer. A top surface of the source-side metallic material portion 42, the drain-side metallic material portion 44, or the gate electrode 52 may be physically exposed at the bottom of each via cavity. The photoresist layer may be subsequently removed, for example, by ashing.

At least one conductive material may be deposited in the via cavities. The at least one conductive material may include, for example, a metallic barrier material layer (such as a layer of TiN, TaN, WN, TiC, TaC, and/or WC) and a metallic fill material (such as W, Cu, Co, Mo, Ru, or a combination thereof). Other suitable conductive and metallic fill materials are within the contemplated scope of disclosure. Excess portions of the at least one conductive material may be removed from above the horizontal plane including the top surface of the contact-level dielectric layer 70 by a planarization process such as a chemical mechanical planarization (CMP) process and/or a recess etch process.

Remaining portions of the at least one conductive material include a source-side contact via structure 72 contacting a top surface of the source-side metallic material portion 42, a drain-side contact via structure 74 contacting a top surface of the drain-side metallic material portion 44, and a gate contact via structure (not illustrated) contacting a top surface of the gate electrode 52. Each of the source-side contact via structure 72, the drain-side contact via structure 74, and the gate contact via structure may have a respective top surface located within a same horizontal plane as the top surface of the contact-level dielectric layer 70.

Another ILD material layer, which is herein referred to as a first-line-level dielectric layer 80, may be formed over the contact-level dielectric layer 70. The first-line-level dielectric layer 80 may include any ILD dielectric material that may be used for the contact-level dielectric layer 70. The ILD dielectric material of the first-line-level dielectric layer 80 may be porous or non-porous. The thickness of the first-line-level dielectric layer 80 may be in a range from 100 nm to 300 nm, although lesser and greater thicknesses may also be used.

Line cavities may be formed in the first-line-level dielectric layer 80, for example, by application and patterning of a photoresist layer (not shown) over the first-line-level dielectric layer 80 and by transfer of the pattern in the photoresist layer through the first-line-level dielectric layer 80 by an anisotropic etch process. At least one conductive material (such as a metallic barrier liner and a metallic fill material) may be deposited in the line cavities to form various metal line structures, which include a first-line-level source-side line structure 82 contacting the source-side contact via structure 72, a first-line-level drain-side line structure 84 contacting the drain-side contact via structure 74, and a first-line-level gate connection line structure (not illustrated) contacting the gate contact via structure.

In the first exemplary OTP memory device of FIG. 1D, the antifuse structure (34, 60, 44) includes a first node, an antifuse dielectric layer 60 located on, and over the first node. The antifuse structure also includes a second node located on, and over, the antifuse dielectric layer 60. The first node comprises the drain region 34, and the second node comprises the drain-side metallic material portion 44 that is vertically spaced from the first node (i.e., drain region 34). The antifuse dielectric layer 60 located between the first node (i.e., drain region 34) and the second node (i.e., drain-side metallic material portion 44).

The source-side metallic material portion 42 comprising the same metallic material as, and may have the same thickness as, the drain-side metallic material portion 44. The source-side metallic material portion 42 electrically contacts the top surface of the source region 32. The source-side contact via structure 72 electrically contacts the top surface of the source-side metallic material portion 42. The drain-side contact via structure 74 electrically contacts the top surface of the drain-side metallic material portion 44. An ILD material layer such as the contact-level dielectric layer 70 laterally surrounds and has formed therein, the source-side metallic material portion 42, the drain-side metallic material portion 44, the source-side contact via structure 72, the drain-side contact via structure 74, and the gate electrode 52.

The drain-side metallic material portion 44 may have a greater lateral extent than the drain-side contact via structure 74, and the source-side metallic material portion 42 may have a greater lateral extent than the source-side contact via structure 72. The source-side contact via structure 72 and the drain-side contact via structure 74 may have a respective top surface within the same horizontal plane as the top surface of the contact-level dielectric layer 70.

Figure 1E:
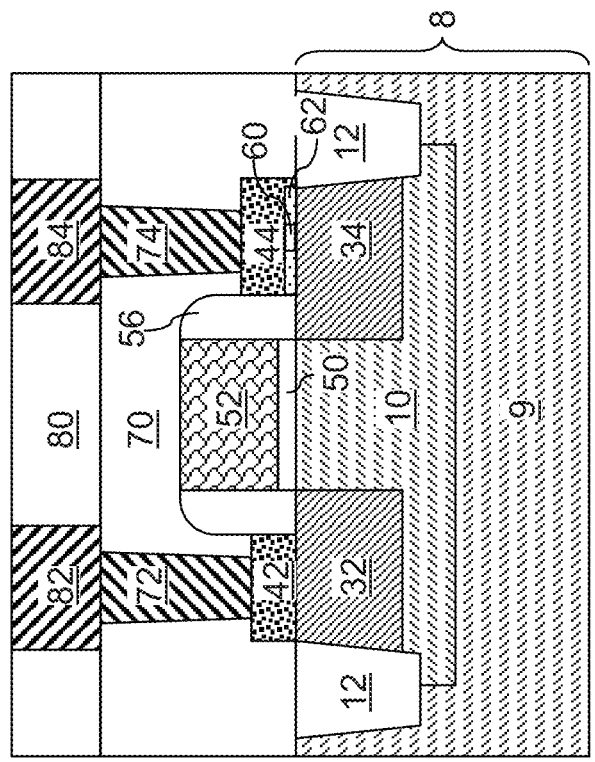
FIG. 1E is a vertical cross-sectional view of a first alternative embodiment of the first exemplary structure according to the first embodiment of the present disclosure.

Referring to FIG. 1E, a first alternative embodiment of the first exemplary structure according to the first embodiment of the present disclosure may be derived from the first exemplary structure of FIG. 1D by patterning the drain-side metallic material portion 44 inside the periphery of the top surface of the antifuse dielectric layer 60. In this embodiment, the antifuse dielectric layer 60 may have a lateral extent that is greater than the lateral extent of the drain-side metallic material portion 44. The periphery of a top surface of the antifuse dielectric layer 60 may be laterally offset outward from the periphery of the bottom surface of the drain-side metallic material portion 44.

Figure 1F:
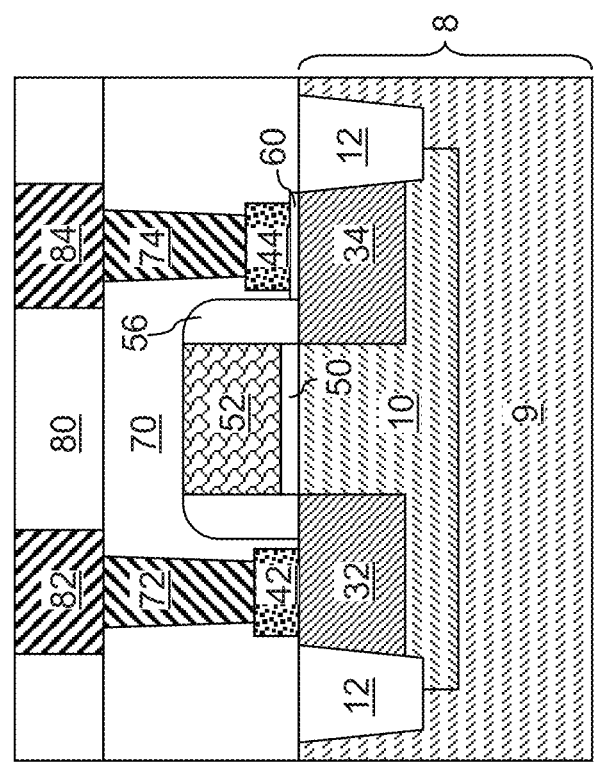
FIG. 1F is a vertical cross-sectional view of a second alternative embodiment of the first exemplary structure according to the first embodiment of the present disclosure.

Referring to FIG. 1F, a second alternative embodiment of the first exemplary structure according to the first embodiment of the present disclosure may be derived from the first exemplary structure of FIG. 1D by forming the drain-side metallic material portion 44 over an area that is greater than the area of the antifuse dielectric layer 60. In this embodiment, the antifuse dielectric layer 60 may have a lateral extent that is lesser than the lateral extent of the drain-side metallic material portion 44. The lesser extent of the antifuse dielectric layer 60 may be provided by using an etch stop dielectric layer 62 laterally surrounding the antifuse dielectric layer 60. For example, an etch stop dielectric layer 62 including a higher dielectric breakdown electrical field strength than the material of the antifuse dielectric layer 60 may be formed over the drain region 34 by deposition and patterning of an etch stop dielectric material. The etch stop dielectric layer 62 may be formed with an opening having a lesser area than the area of a physically exposed surface of the drain region 34. A dielectric material having a lower dielectric breakdown electrical field strength may be deposited in the opening in the etch stop dielectric layer 62 to form the antifuse dielectric layer 60. For example, the dielectric material having the lower dielectric breakdown electrical field strength may be conformally deposited to fill the opening, and may be recessed to remove portions located outside the opening in the etch stop dielectric layer 62. In this embodiment, the antifuse dielectric layer 60 may be located entirely within the opening through the etch stop dielectric layer 62. In an illustrative example, the etch stop dielectric layer 62 may include a dielectric metal oxide, and the antifuse dielectric layer 60 may include silicon oxide.

Figure 1G:
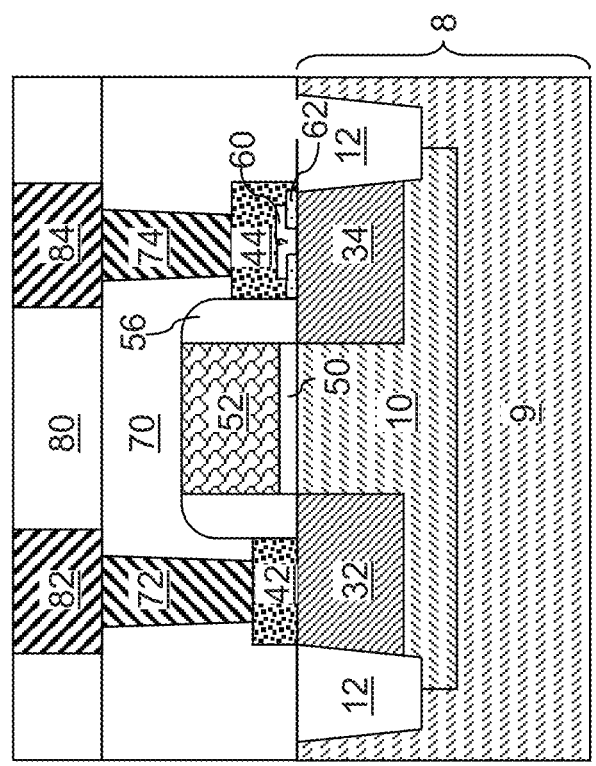
FIG. 1G is a vertical cross-sectional view of a third alternative embodiment of the first exemplary structure according to the first embodiment of the present disclosure.

Referring to FIG. 1G, a third alternative embodiment of the first exemplary structure according to the first embodiment of the present disclosure may be derived from the second alternative embodiment of the first exemplary structure of FIG. 1F by patterning the antifuse dielectric layer 60 such that the antifuse dielectric layer 60 includes a peripheral portion that extends outside the opening in the etch stop dielectric layer 62 and overlies the etch stop dielectric layer 62.

Referring to FIGS. 1A-1G, a one time programmable (OTP) memory device may be provided by forming a field effect transistor (FET) including a source region 32, a drain region 34, a gate dielectric 50, and a gate electrode 52 on a substrate 8, and by forming an antifuse structure (34, 60, 44) including a first node comprising a drain region 34, an antifuse dielectric layer 60 located on, and over the drain region 34. The antifuse structure (34, 60, 44) further comprising a second node comprising the drain-side metallic material portion 44 on, and over, the antifuse dielectric layer 60. The one time programmable (OTP) memory device may comprise a field effect transistor including a source region 32, a drain region 34, a gate dielectric 50, and a gate electrode 52 and located on a substrate 8. The OTP memory device further comprising a semiconductor-insulator-metal (SIM) antifuse structure including the drain region 34 that constitutes a first node, a drain-side metallic material portion 44 that constitutes a second node that is spaced from the first node, and an antifuse dielectric layer 60 located between the first node and the second node.

Figure 2A:
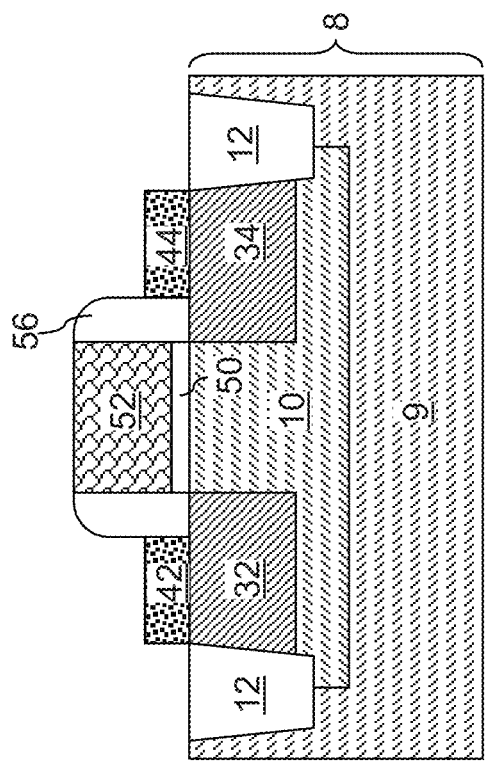
FIGS. 2A-2D are sequential vertical cross-sectional views during formation of a second exemplary structure of an OTP memory device according to a second embodiment of the present disclosure.

FIGS. 2A-2D are sequential vertical cross-sectional views during formation of a second exemplary structure of an OTP memory device according to a second embodiment of the present disclosure. Referring to FIG. 2A, a second exemplary structure for formation of an OTP memory device according to a second embodiment of the present disclosure is illustrated. The initial structure for formation of the OTP memory device of the second embodiment, which may start from a structure identical to the starting first exemplary structure of FIG. 1A.

Figure 2B:
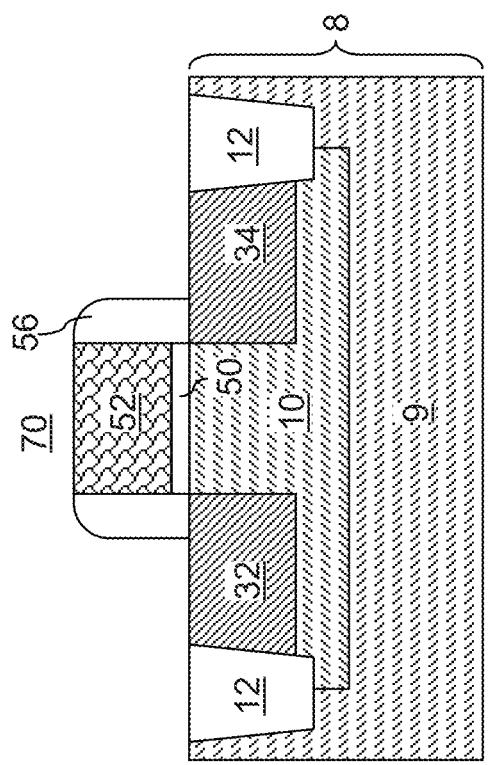

Referring to FIG. 2B, a source-side metallic material portion 42 and a drain-side metallic material portion 44 may be formed on the top surface of the source region 32 and on the top surface of the drain region 34, respectively. The same processing step may be used as the processing steps of FIG. 1C for forming the source-side metallic material portion 42 and a drain-side metallic material portion 44. The drain-side metallic material portion 44 may be formed directly on a top surface of the drain region 34. In contrast to the first exemplary structure, the antifuse dielectric layer 60 is not formed under the drain-side metallic material portion 44.

Figure 2C:
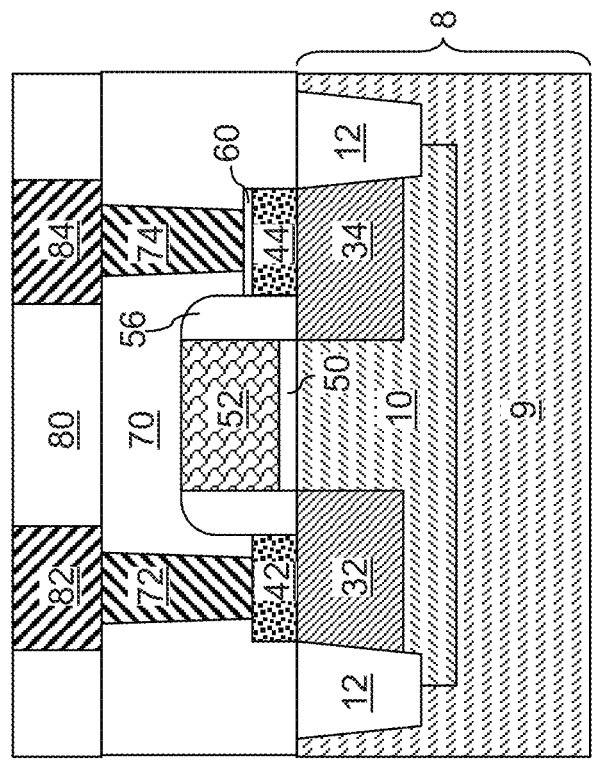

Referring to FIG. 2C, an antifuse dielectric layer 60 may be formed by deposition of a dielectric material layer over the drain-side metallic material portion 44 and over the gate stack (50, 52), by applying and patterning a photoresist layer (not shown) over the dielectric material layer, and by transferring the pattern in the photoresist layer through the dielectric material layer. The photoresist layer may be subsequently removed, for example, by ashing. A remaining portion of the dielectric material layer includes the antifuse dielectric layer 60. The lateral extent of the antifuse dielectric layer 60 may cover the entire area of the top surface of the drain-side metallic material portion 44, or may over only a portion of the top surface of the drain-side metallic material portion 44.

According to an embodiment of the present disclosure, the drain-side metallic material portion 44 may constitute a first node of a one-time programmable (OTP) memory device, and an antifuse dielectric layer 60 may be formed directly on a top surface of the drain-side metallic material portion 44. The antifuse dielectric layer 60 may include the same material, and may have the same thickness as, the antifuse dielectric layer 60 in the first exemplary structure (see e.g., FIGS. 1D-1G).

Figure 2D:
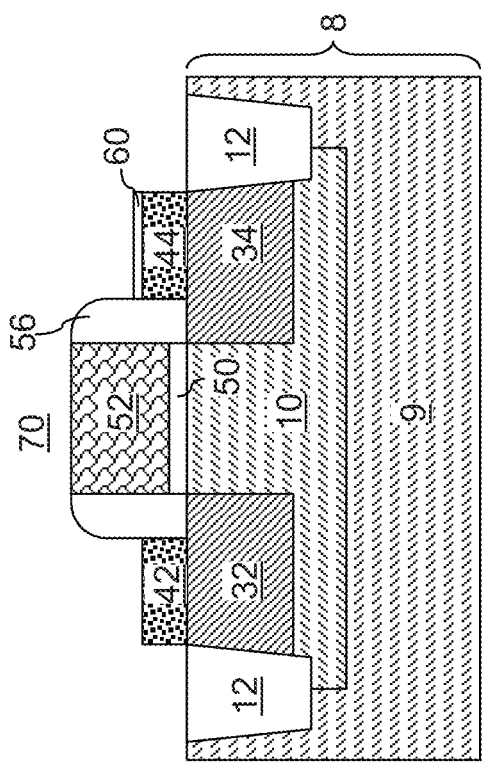

Referring to FIG. 2D, the processing steps of FIG. 1D may be performed to form a contact-level dielectric layer 70, via cavities vertically extending through the contact-level dielectric layer 70, and metal via structures that fill the via cavities. In the second embodiment, the material of the contact-level dielectric layer 70 includes a different dielectric material than the dielectric material of the antifuse dielectric layer 60. Thus, the via cavity that is formed over the antifuse dielectric layer 60 does not extend through the antifuse dielectric layer 60, but stops on the top surface of the antifuse dielectric layer 60. The metal via structures may include a source-side contact via structure 72 contacting a top surface of the source-side metallic material portion 42, a drain-side contact via structure 74 contacting a top surface of the antifuse dielectric layer 60, and a gate contact via structure (not shown) that contacts the gate electrode 52. Each of the source-side contact via structure 72, the drain-side contact via structure 74, and the gate contact via structure may have a respective top surface located within a same horizontal plane as the top surface of the contact-level dielectric layer 70.

A first-line-level dielectric layer 80 and metal line structures formed therein may be formed as in the first embodiment. The metal line structures formed in the first-line-level dielectric layer 80 may include a first-line-level source-side line structure 82 contacting the source-side contact via structure 72, a first-line-level drain-side line structure 84 contacting the drain-side contact via structure 74, and a first-line-level gate connection line structure (not illustrated) contacting the gate contact via structure.

In the second exemplary OTP memory device of FIG. 2D, the antifuse structure (44, 60, 74) includes a first node, an antifuse dielectric layer 60 located on, and over the first node. The antifuse structure (44, 60, 74) of the second exemplary structure further comprising a second node located on, and over, the antifuse dielectric layer 60. The first node comprises the drain-side metallic material portion 44, and the second node comprises the drain-side contact via structure 74 that is vertically spaced from the first node by the antifuse dielectric layer 74. The antifuse dielectric layer 60 located between the first node (i.e., drain-side metallic material portion 44) and the second node (i.e., drain-side contact via structure 74).

The source-side metallic material portion 42 comprising the same metallic material as, and may have the same thickness as, the drain-side metallic material portion 44. The source-side metallic material portion 42 contacts the top surface of the source region 32. The source-side contact via structure 72 contacts the top surface of the source-side metallic material portion 42. The drain-side metallic material portion 44 may contact the top surface of the drain region 34. The drain-side contact via structure 74 contacts the top surface of the antifuse dielectric layer 60. An ILD material layer such as the contact-level dielectric layer 70 laterally surrounds and has formed therein the source-side metallic material portion 42, the drain-side metallic material portion 44, the source-side contact via structure 72, the antifuse dielectric layer 60, the drain-side contact via structure 74, and the gate electrode 52.

The drain-side metallic material portion 44 may have a greater lateral extent than the drain-side contact via structure 74, and the source-side metallic material portion 42 may have a greater lateral extent than the source-side contact via structure 72. The source-side contact via structure 72 and the drain-side contact via structure 74 may have a respective top surface within the same horizontal plane as the top surface of the contact-level dielectric layer 70.

Referring to FIG. 2E, a first alternative embodiment of the second exemplary structure may be derived from the second exemplary structure of FIG. 2D by forming the antifuse dielectric layer 60 to have a same lateral extent as the drain-side contact via structure 74. For example, the topmost portion of the drain-side metallic material portion 44 may include an oxidizable metal such as titanium or ruthenium. Starting with the structure illustrated in FIG. 2B, the processing steps of FIG. 2C may be omitted. Thus, the antifuse dielectric layer 60 may be formed after formation of the via cavities by oxidizing a surface portion of the drain-side metallic material portion 44. In this embodiment, the antifuse dielectric layer 60 may have a same lateral extent as the drain-side contact via structure 74. Metal oxide portions formed on the source-side metallic material portion 42 or the gate electrode 52 may be removed, for example, by a masked etch process that protects the antifuse dielectric layer 60, prior to formation of the source-side contact via structures 72, drain-side contact via structures 74, and gate contact via structures.

Referring to FIG. 2F, a second alternative embodiment of the second exemplary structure may be derived from the second exemplary structure of FIG. 2D by forming the drain-side contact via structure 74 over an area that is greater than the area of the antifuse dielectric layer 60. In this embodiment, the antifuse dielectric layer 60 may have a lateral extent that is lesser than the lateral extent of the drain-side contact via structure 74. The lesser extent of the antifuse dielectric layer 60 may be provided by using an etch stop dielectric layer 62 laterally surrounding the antifuse dielectric layer 60. For example, an etch stop dielectric layer 62 including a higher dielectric breakdown electrical field strength than the material of the antifuse dielectric layer 60 may be formed over the drain-side metallic material portion 44 by deposition and patterning of an etch stop dielectric material. The etch stop dielectric layer 62 may be formed with an opening having a lesser area than the area of a physically exposed surface of the drain-side metallic material portion 44. A dielectric material having a lower dielectric breakdown electrical field strength may be deposited in the opening in the etch stop dielectric layer 62 to form the antifuse dielectric layer 60. For example, the dielectric material having the lower dielectric breakdown electrical field strength may be conformally deposited to fill the opening, and may be recessed to remove portions located outside the opening in the etch stop dielectric layer 62. In this embodiment, the antifuse dielectric layer 60 may be located entirely within the opening through the etch stop dielectric layer 62. In an illustrative example, the etch stop dielectric layer 62 may include a dielectric metal oxide, and the antifuse dielectric layer 60 may include silicon oxide.

Figure 2G:
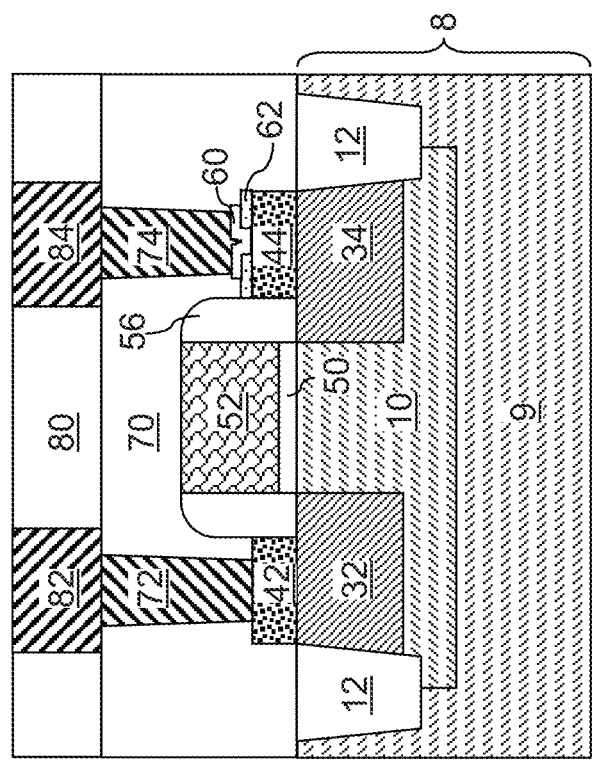
FIG. 2G is a vertical cross-sectional view of a third alternative embodiment of the second exemplary structure according to the first embodiment of the present disclosure.

Referring to FIG. 2G, a third alternative embodiment of the second exemplary structure may be derived from the second alternative embodiment of the second exemplary structure of FIG. 2F by patterning the antifuse dielectric layer 60 such that the antifuse dielectric layer 60 includes a peripheral portion that extends outside the opening in the etch stop dielectric layer 62 and overlies the etch stop dielectric layer 62.

Referring to FIGS. 2A-2G, a one-time programmable (OTP) memory device may be provided by forming a field effect transistor (FET) including a source region 32, a drain region 34, a gate dielectric 50, and a gate electrode 52 on a substrate 8; and by forming an antifuse structure (44, 60, 74) including a first node comprising a drain-side metallic material portion 44, an antifuse dielectric layer 60 located on, or over the drain-side metallic material portion 44. The antifuse structure (34, 60, 44) further comprising a second node comprising a drain-side contact via structure 74 located on, or over, the antifuse dielectric layer 60. The second node comprises a metal via structure formed within a via cavity extending through an interlayer dielectric material layer (such as the contact-level dielectric layer 70) that overlies the field effect transistor. As such, the one time programmable (OTP) memory device comprises: a field effect transistor including a source region 32, a drain region 34, a gate dielectric 50, and a gate electrode 52 and located on a substrate 8. The OTP memory device further comprising a metal-insulator-metal (MIM) antifuse structure (44, 60, 74) including a first node (comprising the drain-side metallic material portion 44) electrically connected to the drain region 34, a second node (comprising the drain-side contact via structure 74) that is vertically spaced from the first node, and an antifuse dielectric layer 60 located between the first node and the second node, wherein the second node comprises a metal via structure that is laterally surrounded by an interlayer dielectric material layer (such as the contact-level dielectric layer 70) that overlies the substrate 8.

In one embodiment, the first node comprises a drain-side metallic material portion 44 that is in electrical contact with the drain region 34; and the second node comprises the metal via structure. In one embodiment, a source-side metallic material portion 42 comprising a same metallic material as the drain-side metallic material portion 44 contacts a top surface of the source region 32. In one embodiment, the metal via structure comprises a drain-side contact via structure 74; and an interlayer dielectric material layer (such as the contact-level dielectric layer 70) that laterally surrounds and has formed therein, the drain-side metallic material portion 44 and the drain-side contact via structure 74, wherein a top surface of the metal via structure is located within a horizontal plane including a top surface of the interlayer dielectric material layer.

In one embodiment, the antifuse dielectric layer 60 has a lateral extent that is greater than, or the same as, a lateral extent of the second node (which may comprise the drain-side contact via structure 74). In one embodiment, the antifuse dielectric layer 60 has a lateral extent that is less than the lateral extent of the second node (which may comprise the drain-side contact via structure 74).

Figure 3B:
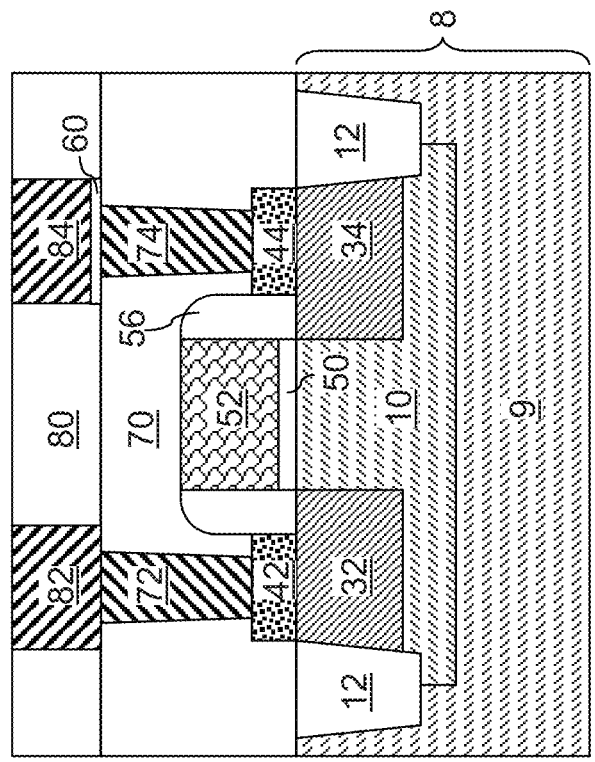
FIGS. 3A-3E are vertical cross-sectional views of various embodiments of a third exemplary structure including an OTP memory device according to a third embodiment of the present disclosure.
Figure 3A:
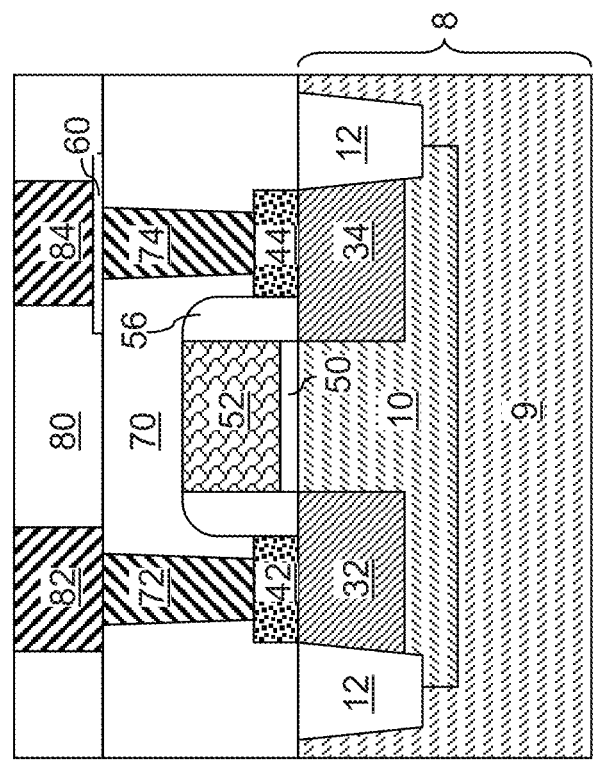

Referring to FIG. 3A, a first embodiment of a third exemplary structure may be derived from the first exemplary structure of FIG. 1A by omitting the processing steps of FIG. 1B and by performing the processing steps of FIG. 1C and by performing a subset of the processing steps of FIG. 1D up to the process of formation of the source-side contact via structure 72, the drain-side contact via structure 74, and the gate contact via structure.

An antifuse dielectric layer 60 may be formed on a top surface of the drain-side contact via structure 74 by application and patterning of a dielectric material layer. The antifuse dielectric layer 60 may have the same material composition and the same thickness as in the first embodiment. Subsequently, a first-line-level dielectric layer 80 and various metal line structures may be formed above the contact-level dielectric layer 70 and the antifuse dielectric layer 60. The metal line structures include a first-line-level source-side line structure 82 contacting the source-side contact via structure 72, a first-line-level drain-side line structure 84 contacting the drain-side contact via structure 74, and a first-line-level gate connection line structure (not illustrated) contacting the gate contact via structure. The antifuse dielectric layer 60 may have a greater lateral extent than the first-line-level drain-side line structure 84. Thus, the antifuse structure of the third exemplary structure may comprise a first node (i.e., drain-side contact via structure 74), antifuse dielectric layer 60, and a second node (i.e., first-line-level drain-side line structure 84).

Referring to FIG. 3B, a second embodiment of the third exemplary structure may be derived from the first embodiment of the third exemplary structure by changing the lateral extent of the antifuse dielectric layer 60 such that the antifuse dielectric layer 60 has a same lateral extent as the first-line-level drain-side line structure 84.

Figure 3C:
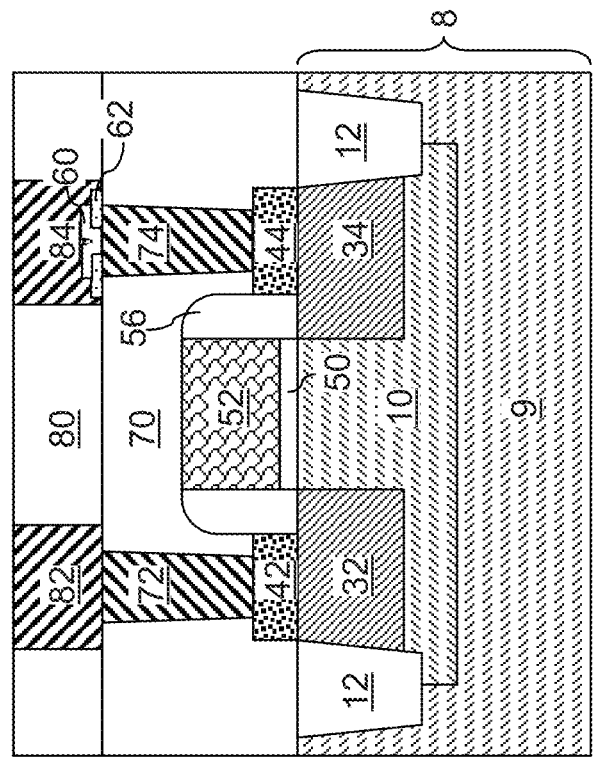

Referring to FIG. 3C, a third embodiment of the third exemplary structure may be derived from the first embodiment of the third exemplary structure of FIG. 3A by using an etch stop dielectric layer 62 laterally surrounding the antifuse dielectric layer 60. For example, an etch stop dielectric layer 62 including a higher dielectric breakdown electrical field strength than the material of the antifuse dielectric layer 60 may be formed over the drain-side contact via structure 74 by deposition and patterning of an etch stop dielectric material. The etch stop dielectric layer 62 may be formed with an opening having a lesser area than the area of the first-line-level drain-side line structure 84 to be subsequently formed thereupon. A dielectric material having a lower dielectric breakdown electrical field strength may be deposited in the opening in the etch stop dielectric layer 62 to form the antifuse dielectric layer 60. For example, the dielectric material having the lower dielectric breakdown electrical field strength may be conformally deposited to fill the opening, and may be recessed to remove portions located outside the opening in the etch stop dielectric layer 62. In this embodiment, the antifuse dielectric layer 60 may be located entirely within the opening through the etch stop dielectric layer 62. In an illustrative example, the etch stop dielectric layer 62 may include a dielectric metal oxide, and the antifuse dielectric layer 60 may include silicon oxide.

Figure 3D:
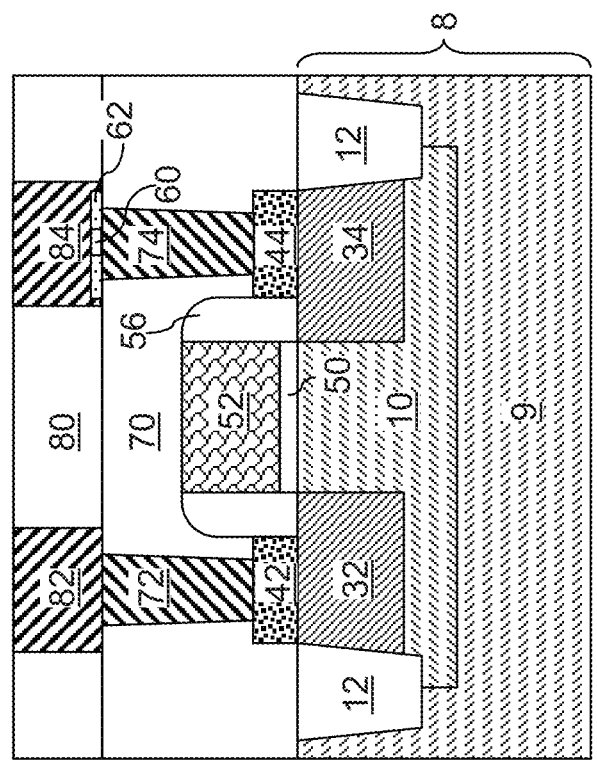

Referring to FIG. 3D, a fourth embodiment of the third exemplary structure according to the third embodiment of the present disclosure may be derived from the third embodiment of the third exemplary structure of FIG. 3C by patterning the antifuse dielectric layer 60 such that the antifuse dielectric layer 60 includes a peripheral portion that extends outside the opening in the etch stop dielectric layer 62 and overlies the etch stop dielectric layer 62.

Figure 3E:
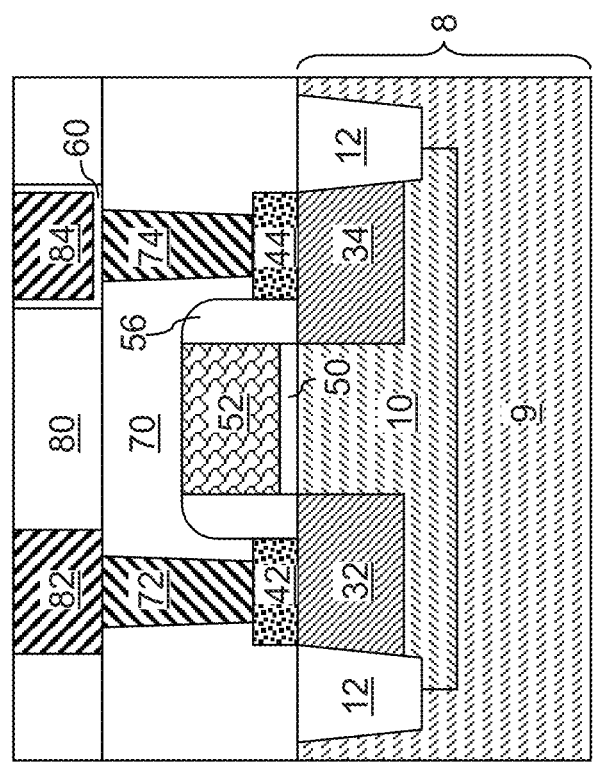

Referring to FIG. 3E, a fifth embodiment of the third exemplary structure according to the third embodiment of the present disclosure may be derived from the first embodiment of the third exemplary structure by forming the antifuse dielectric layer 60 within a line cavity that overlies the drain-side contact via structure 74. In this embodiment, the antifuse dielectric layer 60 may have a horizontal portion located between the drain-side contact via structure 74 and the first-line-level drain-side line structure 84, and may have vertically-extending portions located on the sidewalls of the via cavity in the first-line-level dielectric layer 80.

Referring to FIGS. 3A-3E, a one time programmable (OTP) memory device may be provided by forming a field effect transistor including a source region 32, a drain region 34, a gate dielectric 50, and a gate electrode 52 on a substrate 8; and forming an antifuse structure including a first node (comprising the drain-side contact via structure 74), an antifuse dielectric layer 60, and a second node (comprising a first-line-level drain-side line structure 84) on, and over, the antifuse dielectric layer 60. The first node comprises a metal via structure (comprising the drain-side contact via structure 74) formed within a via cavity extending through an interlayer dielectric material layer (such as the contact-level dielectric layer 70) that overlies the field effect transistor. The second node comprises a metal via structure (comprising the first-line-level drain-side line structure 84) formed within a via cavity extending through an interlayer dielectric material layer (such as the first-line-level dielectric layer 80). As such, the one time programmable (OTP) memory device may comprise: a field effect transistor including a source region 32, a drain region 34, a gate dielectric 50, and a gate electrode 52 and located on a substrate 8; and a metal-insulator-metal (MIM) antifuse structure (74, 60, 84) including a first node (comprising a drain-side contact via structure 74) electrically connected to the drain region 34, a second node (comprising a first-line-level drain-side line structure 84) that is vertically spaced from the first node, and an antifuse dielectric layer 60 located between the first node and the second node, wherein the first node comprises a metal via structure (comprising the drain-side contact via structure 74) that is laterally surrounded by an interlayer dielectric material layer (such as the contact-level dielectric layer 70) that overlies the substrate 8.

A metal line structure (such as a first-line-level drain-side line structure 84) may be formed in another interlayer dielectric material layer (such as the first-line-level dielectric layer 80) may be formed over the metal via structure (comprising the drain-side contact via structure 74) and the antifuse dielectric layer 60, wherein the first node comprises the metal via structure, and the second node comprises the metal line structure. Thus, one of the first node and the second node comprises the metal via structure (comprising the drain-side contact via structure 74), and another of the first node and the second node comprises a metal line structure (comprising a first-line-level drain-side line structure 84) that overlies or underlies the metal via structure.

In one embodiment, the antifuse dielectric layer 60 has a lateral extent that is greater than, or the same as, a lateral extent of the second node (which may comprise the first-line-level drain-side line structure 84). In one embodiment, the antifuse dielectric layer 60 has a lateral extent that is less than the lateral extent of the second node (comprising the first-line-level drain-side line structure 84).

Figure 4A:
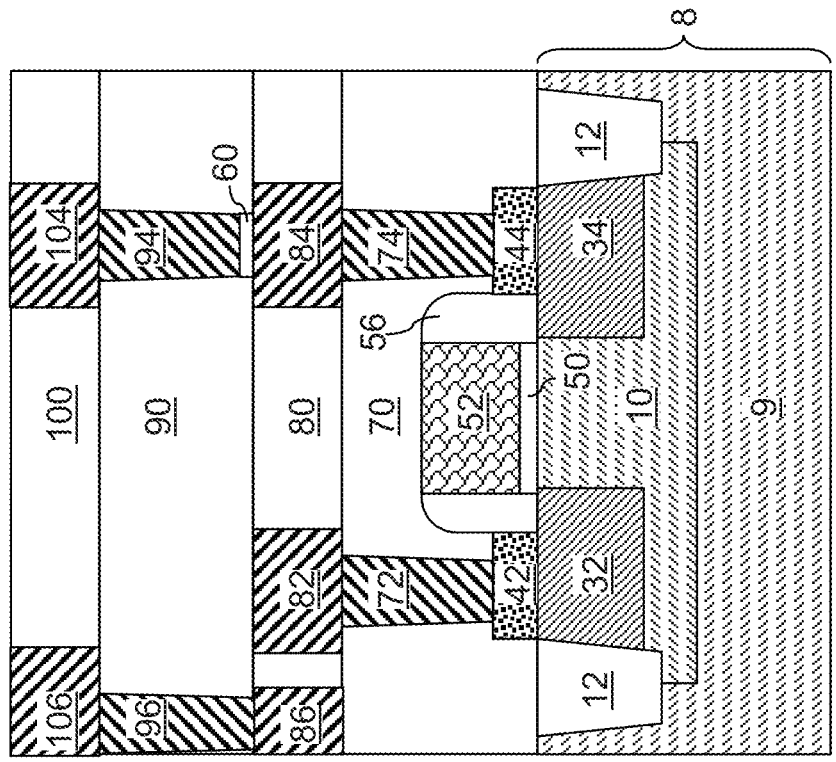
FIGS. 4A-4D are vertical cross-sectional views of various embodiments of a fourth exemplary structure including an OTP memory device according to a fourth embodiment of the present disclosure.

Referring to FIG. 4A, a first embodiment of a fourth exemplary structure may be derived from the third exemplary structure of FIG. 3A by deferring formation of the antifuse dielectric layer 60 until after formation of the first-line-level drain-side line structure 84. In this embodiment, the antifuse dielectric layer 60 may be formed directly on the top surface of the first-line-level drain-side line structure 84 by deposition and patterning of a dielectric material layer. The antifuse dielectric layer 60 may have the same material composition and the same thickness as in the first exemplary structure. Additional first-line-level metal line structures 86 may be formed in the first-line-level dielectric layer 80. The additional first-line-level metal line structures 86 may provide electrical interconnection for various other devices that are formed on the substrate 8.

Additional ILD material layers may be deposited, and additional metal interconnect structures may be formed in the additional ILD material layers. For example, a first-via-level dielectric layer 90 may be formed over the first-line-level dielectric layer 80 and the antifuse dielectric layer 60. The first-via-level dielectric layer 90 includes a dielectric material that may be etched selective to the material of the antifuse dielectric layer 60. Via cavities may be formed through the first-via-level dielectric layer 90, and may be filled with at least one conductive material to form metal via structures. The metal via structures may include a first-via-level metal via structure 94 contacting a top surface of the antifuse dielectric layer 60, and an additional first-via-level metal via structure 96 contacting top surfaces of the additional first-line-level metal line structure 86.

A second-line-level dielectric layer 100 may be formed over the first-via-level dielectric layer 90. Line cavities may be formed through the second-line-level dielectric layer 100, and may be filled with at least one conductive material to form metal line structures. The metal line structures may include a second-line-level metal line structure 104 contacting a top surface of the first-via-level metal via structure 94, and additional second-line-level metal via structure 106 contacting the additional first-via-level metal via structures 96.

Figure 4B:
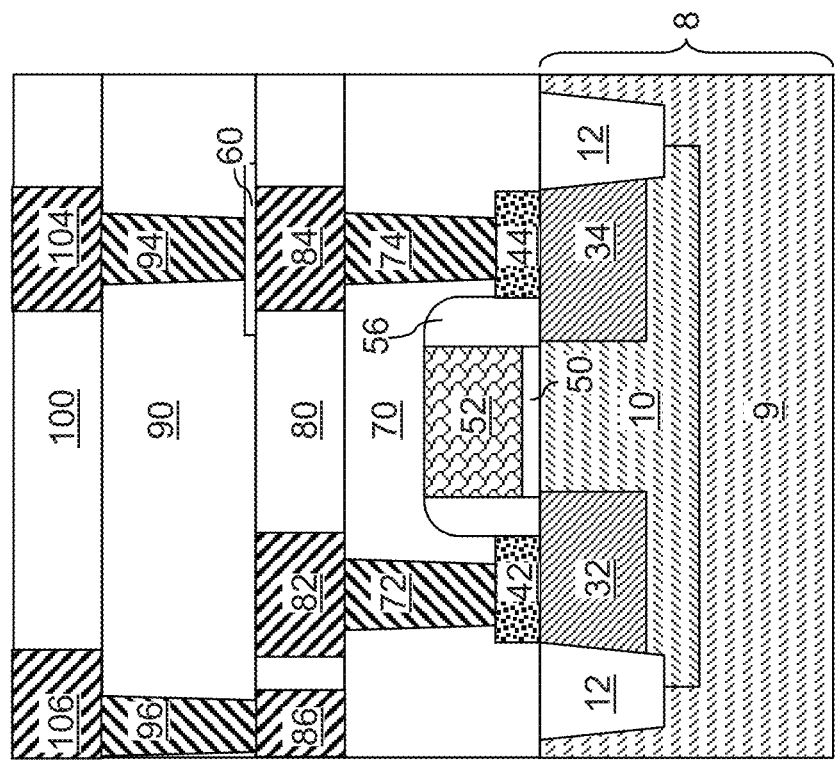

Referring to FIG. 4B, a second embodiment of the fourth exemplary structure may be derived from the first embodiment of the fourth exemplary structure by forming the antifuse dielectric layer 60 such that the antifuse dielectric layer 60 has a same lateral extent as a bottom surface of the first-via-level metal via structure 94. For example, the topmost portion of the first-line-level drain-side line structure 84 may include an oxidizable metal such as titanium or ruthenium. The antifuse dielectric layer 60 may be formed after formation of the via cavities through the first-via-level dielectric layer 90 by oxidizing a surface portion of the first-line-level drain-side line structure 84. In this embodiment, the antifuse dielectric layer 60 may have a same lateral extent as the first-via-level metal via structure 94. Metal oxide portions formed on the additional first-line-level metal line structures 86 may be removed, for example, by a masked etch process that protects the antifuse dielectric layer 60, prior to formation of the first-via-level metal via structure 94 and the additional first-via-level metal via structures 96.

Figure 4C:
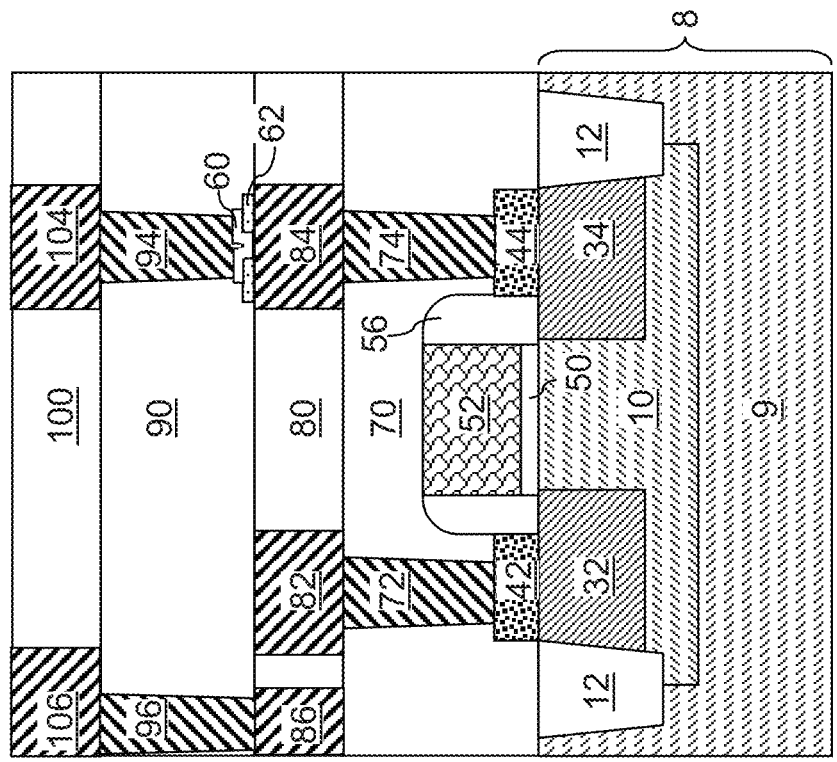

Referring to FIG. 4C, a third embodiment of the fourth exemplary structure may be derived from the first embodiment of the fourth exemplary structure of FIG. 4A by using an etch stop dielectric layer 62 laterally surrounding the antifuse dielectric layer 60. For example, an etch stop dielectric layer 62 including a higher dielectric breakdown electrical field strength than the material of the antifuse dielectric layer 60 may be formed over the first-line-level drain-side line structure 84 by deposition and patterning of an etch stop dielectric material. The etch stop dielectric layer 62 may be formed with an opening having a lesser area than the area of the first-line-level drain-side line structure 84 to be subsequently formed thereupon. A dielectric material having a lower dielectric breakdown electrical field strength may be deposited in the opening in the etch stop dielectric layer 62 to form the antifuse dielectric layer 60. For example, the dielectric material having the lower dielectric breakdown electrical field strength may be conformally deposited to fill the opening, and may be recessed to remove portions located outside the opening in the etch stop dielectric layer 62. In this embodiment, the antifuse dielectric layer 60 may be located entirely within the opening through the etch stop dielectric layer 62. In an illustrative example, the etch stop dielectric layer 62 may include a dielectric metal oxide, and the antifuse dielectric layer 60 may include silicon oxide.

Figure 4D:
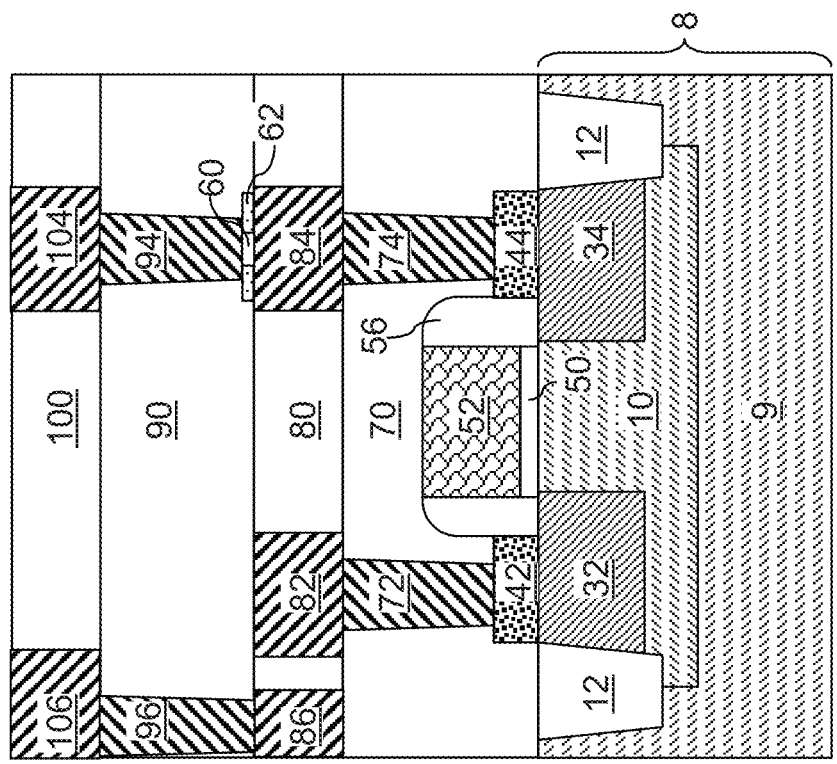

Referring to FIG. 4D, a fourth embodiment of the fourth exemplary structure may be derived from the third embodiment of the fourth exemplary structure of FIG. 4C by patterning the antifuse dielectric layer 60 such that the antifuse dielectric layer 60 includes a peripheral portion that extends outside the opening in the etch stop dielectric layer 62 and overlies the etch stop dielectric layer 62.

Referring to FIG. 5A, a first embodiment of a fifth exemplary structure may be derived from the first embodiment of the fourth exemplary structure of FIG. 4A by deferring formation of the antifuse dielectric layer 60 until after formation of the second-line-level drain-side line structure 94. In this embodiments, the antifuse dielectric layer 60 may be formed directly on a top surface of the first-via-level metal line structure 94. Additional embodiments of the fifth exemplary structure may be derived from the first embodiment of the fifth exemplary structure by using the processing steps of FIG. 4B, 4C, or 4D to form the antifuse dielectric layer 60 to change the lateral extent of the antifuse dielectric layer 60 relative to the lateral extent of the second-line-level metal line structure 104.

Referring to FIG. 5B, a second embodiment of the fifth exemplary structure may be derived from the first embodiment of the fifth exemplary structure by forming the antifuse dielectric layer 60 inside a line cavity overlying the first-via-level metal via structure 94. In this embodiment, the antifuse dielectric layer 60 may have a horizonal portion located between the first-via-level metal via structure 94 and the second-line-level metal line structure 104, and may have vertically-extending portions located on the sidewalls of the via cavity in the second-line-level dielectric layer 100.

Figure 6:
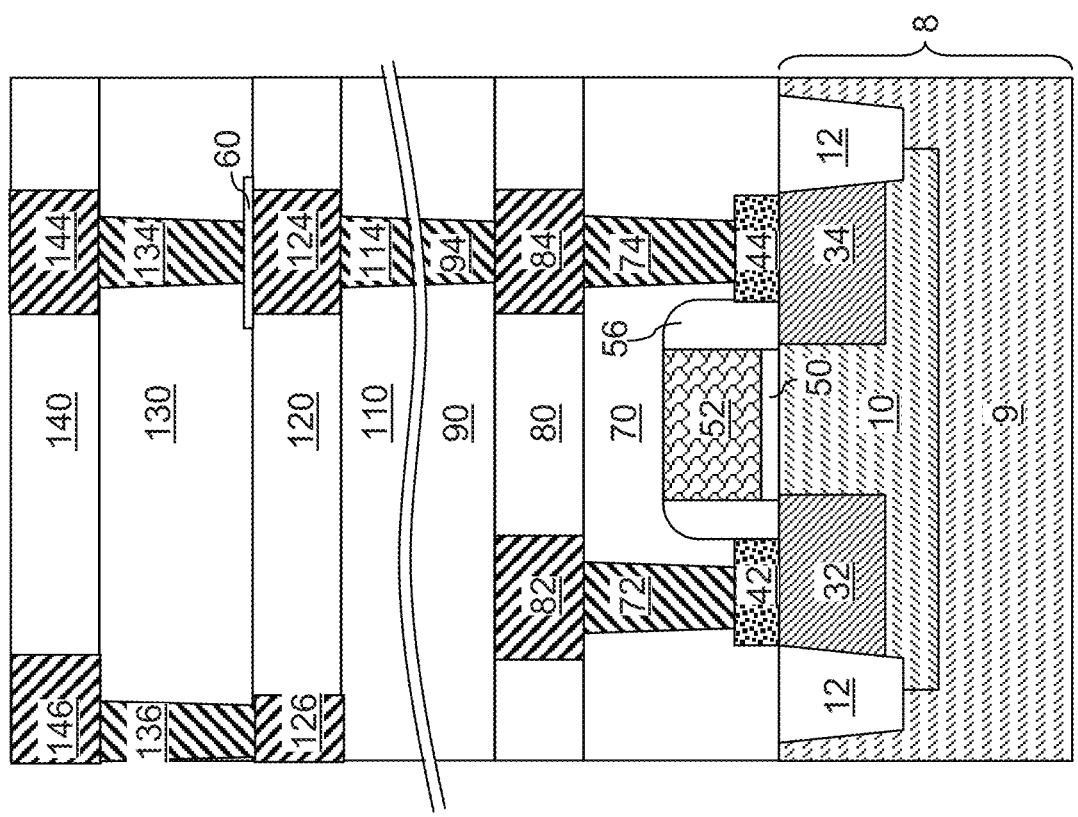
FIG. 6 is a vertical cross-sectional view of a sixth exemplary structure including an OTP memory device according to a sixth embodiment of the present disclosure.

Referring to FIG. 6, a sixth exemplary structure according to a sixth embodiment of the present disclosure may be derived from the first embodiment of the fourth exemplary structure by forming the antifuse dielectric layer 60 directly on a top surface of an N-th-line-level metal line structure 124 in which N is a positive integer greater than 1. Generally, an N-th-line-level dielectric layer 120 may have formed therein the N-th-line-level metal line structure 124 and additional N-th-line-level metal line structures 126. An (N−1)-th-via-level dielectric layer 110 having formed therein (N−1)-th-via-level metal via structures 114 may be provided underneath the N-th-line-level dielectric layer 120. The N-th-line-level metal line structure 124 may be electrically connected to the drain region 34 through the drain-side metallic material portion 44, the first-line-level drain-side line structure 84, the first-via-level metal via structure 94, the (N−1)-th-via-level metal via structures 114 (in embodiments in which N is greater than 2), and any other intervening metal interconnect structures.

After formation of the antifuse dielectric layer 60, additional ILD material layers may be deposited, and additional metal interconnect structures may be formed in the additional ILD material layers. For example, an (N-th)-via-level dielectric layer 130 may be formed over the N-th-line-level dielectric layer 120 and the antifuse dielectric layer 60. The N-th-via-level dielectric layer 130 includes a dielectric material that may be etched selective to the material of the antifuse dielectric layer 60. Via cavities may be formed through the N-th-via-level dielectric layer 130, and may be filled with at least one conductive material to form metal via structures. The metal via structures may include an N-th-via-level metal via structure 134 contacting a top surface of the antifuse dielectric layer 60, and additional N-th-via-level metal via structure 136 contacting top surfaces of the additional (N-th)-line-level metal line structure 126.

An (N+1)-th-line-level dielectric layer 140 may be formed over the N-th-via-level dielectric layer 130. Line cavities may be formed through the (N+1)-th-line-level dielectric layer 140, and may be filled with at least one conductive material to form metal line structures. The metal line structures may include an (N+1)-th-line-level metal line structure 144 contacting a top surface of the N-th-via-level metal via structure 134, and additional (N+1)-th-line-level metal via structure 146 contacting the additional N-th-via-level metal via structures 136.

An antifuse structure includes a first node comprising the N-th-line-level metal line structure 124, a second node comprising the N-th-via-level metal via structure 134, and the antifuse dielectric layer 60. Additional embodiments of the sixth exemplary structure may be derived from the sixth exemplary structure of FIG. 6 by using the processing steps of FIG. 4B, 4C, or 4D to form the antifuse dielectric layer 60 to change the lateral extent of the antifuse dielectric layer 60 relative to the lateral extent of the N-th-via-level metal via structure 134.

Figure 7A:
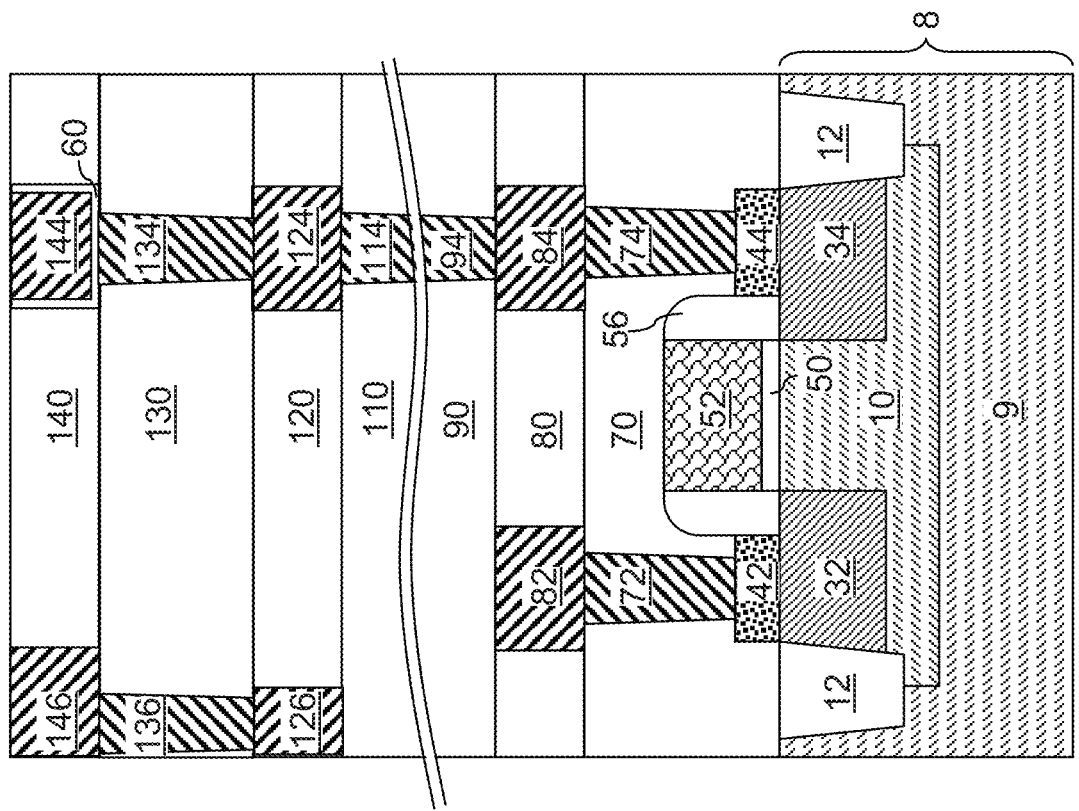
FIGS. 7A and 7B are vertical cross-sectional views of various embodiments of a seventh exemplary structure including an OTP memory device according to a seventh embodiment of the present disclosure.

Referring to FIG. 7A, a first embodiment of a seventh exemplary structure may be derived from the sixth exemplary structure by forming the antifuse dielectric layer 60 directly on a top surface of an N-th-via-level metal via structure 134 in which N is a positive integer greater than 1. An antifuse structure includes a first node comprising the N-th-via-level metal via structure 134, a second node comprising the (N+1)-th-line-level metal line structure 144, and the antifuse dielectric layer 60. Additional embodiments of the seventh exemplary structure may be derived from the first embodiment of the seventh exemplary structure of FIG. 7A by using the processing steps of FIG. 4B, 4C, or 4D to form the antifuse dielectric layer 60 to change the lateral extent of the antifuse dielectric layer 60 relative to the lateral extent of the (N+1)-th-line-level metal line structure 144.

Figure 7B:
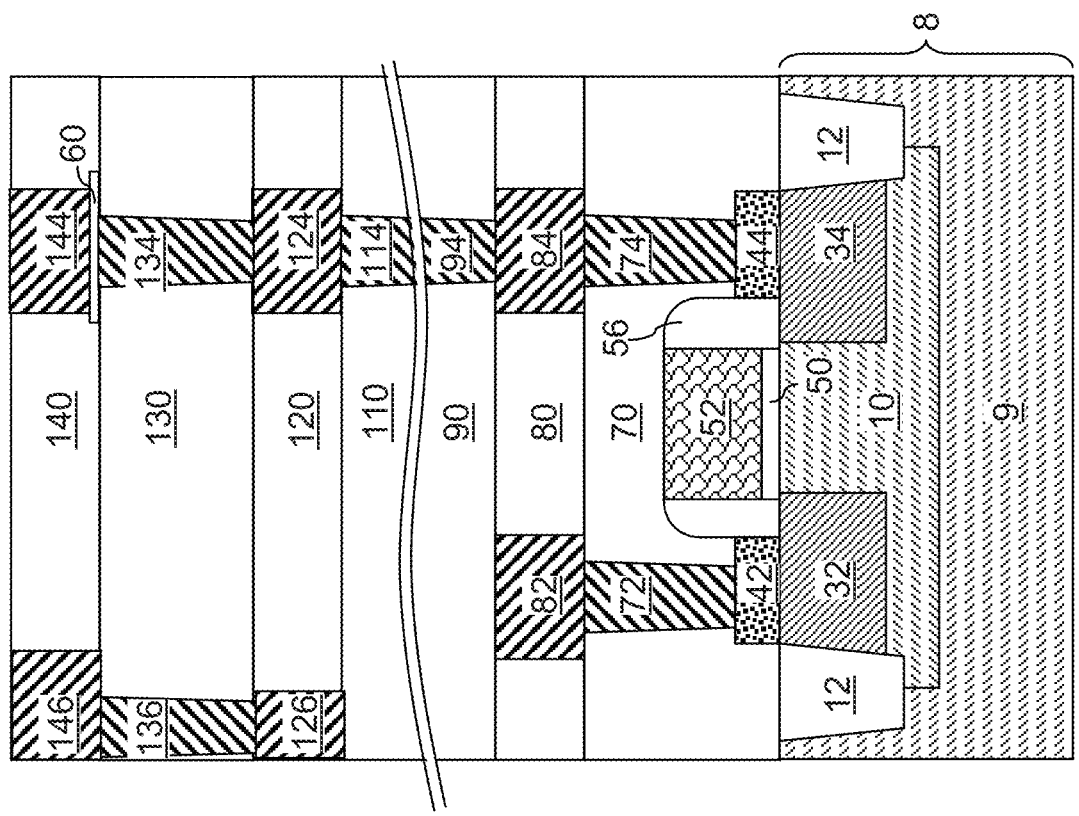

Referring to FIG. 7B, a second embodiment of the seventh exemplary structure may be derived from the first embodiment of the seventh exemplary structure by forming the antifuse dielectric layer inside a line cavity overlying the N-th-via-level metal via structure 134. In this embodiment, the antifuse dielectric layer 60 may have a horizontal portion located between the N-th-via-level metal via structure 134 and the (N+1)-th-line-level metal line structure 144, and may have vertically-extending portions located on the sidewalls of the via cavity in the (N+1)-th-line-level dielectric layer 140.

Referring collectively to FIGS. 4A-7B, a one-time programmable memory device may be provided by forming a field effect transistor including a source region 32, a drain region 34, a gate dielectric 50, and a gate electrode 52 on a substrate 8; and forming an antifuse structure {(84, 60, 94), (94, 60, 104), (124, 60, 134), (134, 60, 144) including a first node (84, 94, 124, or 135), an antifuse dielectric layer 60, and a second node (94, 104, 134, or 144) on, or over, the antifuse dielectric layer 60, wherein one of the first node (84, 94, 124, or 135) and the second node (94, 104, 134, or 144) comprises a metal via structure (94, 134) that is formed within a via cavity extending through an interlayer dielectric material layer (90, 130) that overlies the field effect transistor. As such, the one time programmable (OTP) memory device may comprise: a field effect transistor including a source region 32, a drain region 34, a gate dielectric 50, and a gate electrode 52 and located on a substrate 8; and a metal-insulator-metal (MIM) antifuse structure including a first node (84, 94, 124, or 135) electrically connected to the drain region 34, a second node (94, 104, 134, or 144) that is vertically spaced from the first node (84, 94, 124, or 135), and an antifuse dielectric layer 60 located between the first node (84, 94, 124, or 135) and the second node (94, 104, 134, or 144), wherein one of the first node (84, 94, 124, or 134) and the second node (94, 104, 134, or 144) comprises a metal via structure (94, 134) that is laterally surrounded by an interlayer dielectric material layer (90, 130) that overlies the substrate 8. Another of the first node (84, 94, 124, or 134) and the second node (94, 104, 134, or 144) comprises a metal line structure (84, 104, 124, 144) that overlies or underlies the metal via structure (94, 134).

In some embodiments, a metal line structure (104, 144) formed in another interlayer dielectric (ILD) material layer (100, 140) may be formed over the metal via structure (104, 144) and the antifuse dielectric layer 60, wherein the first node comprises the metal via structure (94, 134), and the second node comprises the metal line structure (104, 144).

In some other embodiments, the antifuse dielectric layer 60 and the metal via structure (104, 144) may be formed over a metal line structure (94, 134) that is formed in another interlayer dielectric (ILD) material layer (90, 130). The first node comprises the metal line structure (84, 124), and the second node comprises the metal via structure (94, 134).

The antifuse dielectric layer 60 may have a lateral extent that is greater than, the same as, or less than, a lateral extent of the second node (94, 104, 134, or 144), i.e., the lateral extent of the bottom surface of the second node (94, 104, 134, or 144).

Figure 8A:
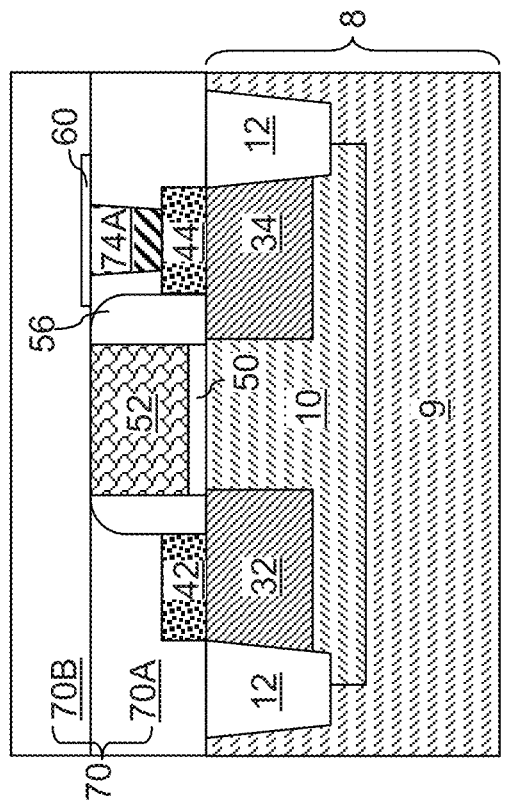
FIGS. 8A-8C are sequential vertical cross-sectional views during formation of an eighth exemplary structure including an OTP memory device according to an eighth embodiment of the present disclosure.
Figure 8B:
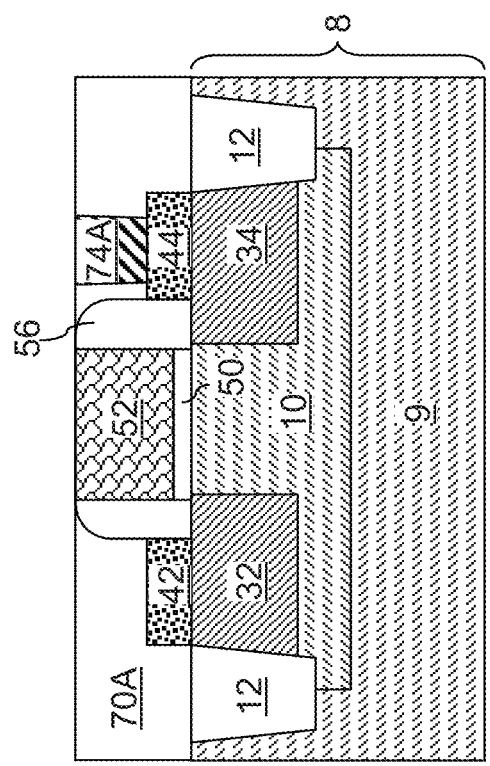
Figure 8C:
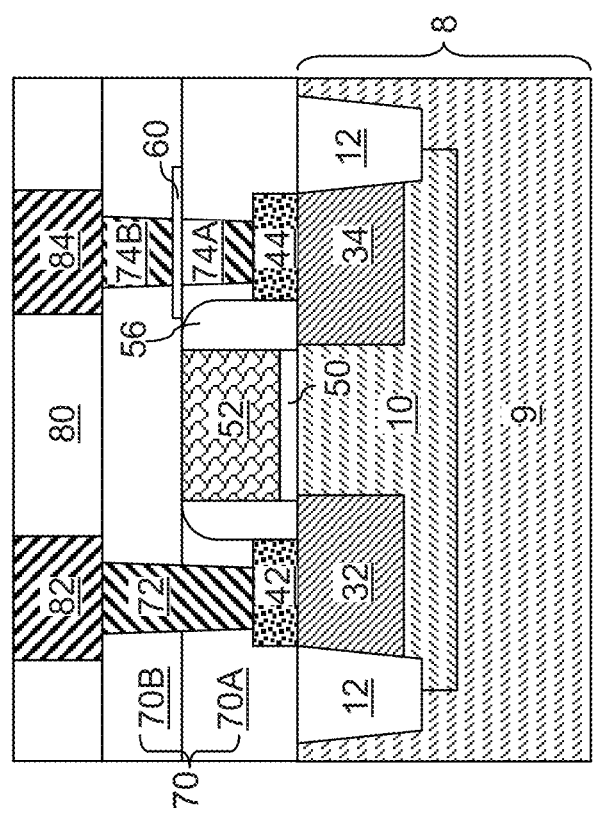

FIGS. 8A-8C are sequential vertical cross-sectional views during formation of an eighth exemplary structure including an OTP memory device according to an embodiment of the present disclosure. Referring to FIG. 8A, an eighth exemplary structure for forming an OTP memory device may be derived from the first exemplary structure of FIG. 1A by forming an ILD material layer (which is herein referred to as a lower contact-level dielectric layer 70A) over the source-side metallic material portion 42 and the drain-side metallic material portion 44. The top surface of the lower contact-level dielectric layer 70A may be planarized to provide a horizontal top surface. For example, the top surface of the lower contact-level dielectric layer 70A may be coplanar with the top surface of the gate electrode 52.

A via cavity may be formed though the lower contact-level dielectric layer 70A directly above the drain-side metallic material portion 44. The via cavity may be filled with at least one metallic material to form a metal via structure, which is herein referred to as a lower drain-side contact via structure 74A.

Referring to FIG. 8B, an antifuse dielectric layer 60 may be formed on the top surface of the lower drain-side contact via structure 74A using any of the processing steps of FIG. 1B, 1F, or 1G. Another ILD dielectric layer (which is herein referred to as an upper contact-level dielectric layer 70B) may be deposited over the lower contact-level dielectric layer 70A and the antifuse dielectric layer 60. The upper contact-level dielectric layer 70B includes a dielectric material that may be etched selective to the dielectric material of the antifuse dielectric layer 60.

Referring to FIG. 8C, via cavities may be formed through the upper contact-level dielectric layer 70B. An anisotropic etch process having an etch chemistry that is selective to the material of the antifuse dielectric layer 60 may be performed to form a via cavity extending down to a top surface of the antifuse dielectric layer 60. The anisotropic etch process may form another via cavity that vertically extends to a top surface of the source-side metallic material portion 42. Alternatively, an additional anisotropic etch process may be performed to form a via cavity that vertically extends to a top surface of the source-side metallic material portion 42 while the portion of the upper contact-level dielectric layer 70B overlying the antifuse dielectric layer 60 is masked by a patterned photoresist layer (not shown), which is subsequently removed.

At least one metallic material may be deposited in the cavities through the upper contact-level dielectric layer 70B and the lower contact-level dielectric layer 70A. A source-side contact via structure 72 may be formed on the source-side metallic material portion 42, and an upper drain-side contact via structure 74B may be formed on the antifuse dielectric layer 60. The combination of the lower contact-level dielectric layer 70A and the upper contact-level dielectric layer 70B constitutes a contact-level dielectric layer 70. A top surface of the source-side contact via structure 72 and a top surface of the upper drain-side contact via structure 74B may be formed within a same horizontal plane as the top surface of the contact-level dielectric layer 70 (i.e., top surface of upper contact-level dielectric layer 70B). Subsequently, a first-line-level dielectric layer 80 and metal line structures formed therein may be formed. The metal line structures may include a first-line-level source-side line structure 82 contacting the source-side contact via structure 72, a first-line-level drain-side line structure 84 contacting the upper drain-side contact via structure 74B, and a first-line-level gate connection line structure (not illustrated) contacting the gate contact via structure.

The eighth exemplary structure includes an antifuse structure (74A, 60, 74B) that includes a first node comprising the lower drain-side contact via structure 74A, a second node comprising the upper drain-side contact via structure 74B, and an antifuse dielectric layer 60 located between the first node and the second node.

Figure 9D:
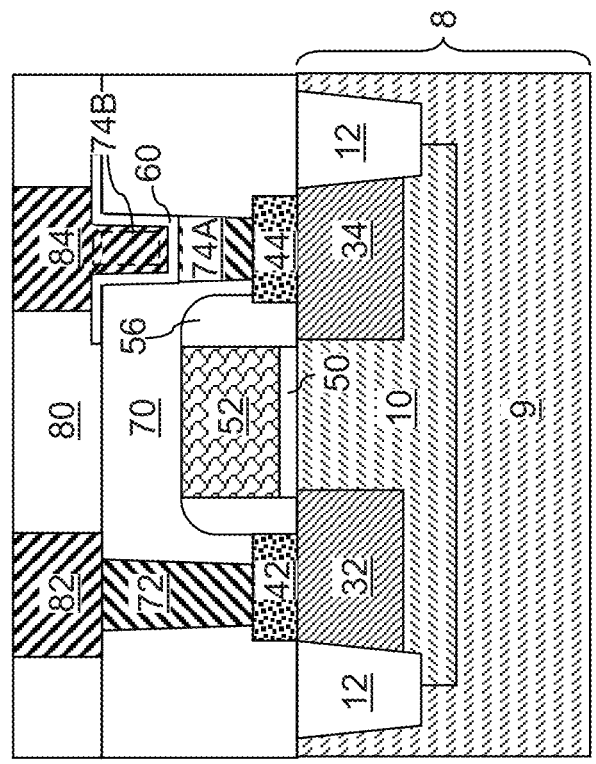

FIGS. 9A-9D are sequential vertical cross-sectional views of a ninth exemplary structure during formation of an OTP memory device according to a ninth embodiment of the present disclosure. Referring to FIG. 9A, a ninth exemplary structure for formation of an OTP memory device may be derived from the third exemplary structure of FIG. 3A by modifying the step for forming the antifuse dielectric layer 60. Specifically, the contact-level dielectric layer 70, the source-side contact via structure 72, and the drain-side contact via structure 74 may be formed in the same manner as in the third embodiment.

Referring to FIG. 9B, a photoresist layer 59 may be applied over the contact-level dielectric layer 70, and may be lithographically patterned to form an opening over the area of the drain-side contact via structure 74. The drain-side contact via structure 74 may be vertically recessed to form a recess cavity 79 over a remaining portion of the drain-side contact via structure 74, which is herein referred to as a lower drain-side contact via structure 74A. The depth of the recess cavity 79 may be in a range from 10% to 90%, such as from 25% to 75%, of the height of the drain-side contact via structure 74 as formed at the processing steps of FIG. 9A, although lesser and greater percentages may also be used. The photoresist layer 59 may be subsequently removed, for example, by ashing.

Figure 9C:
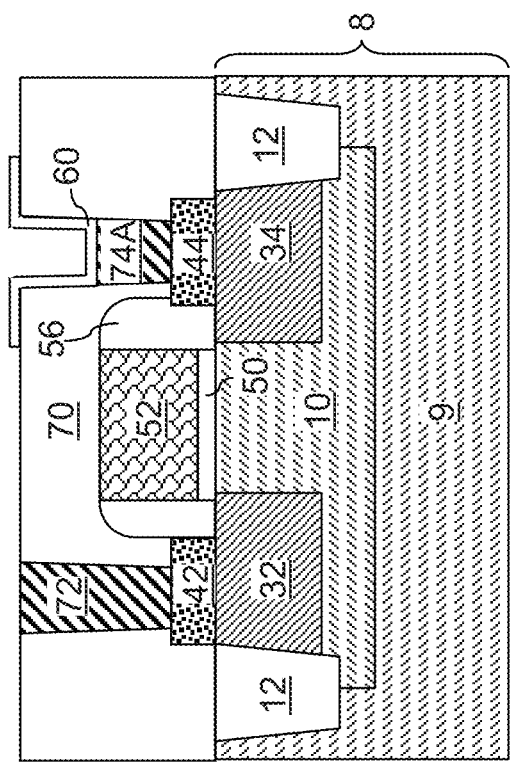

Referring to FIG. 9C, an antifuse dielectric layer 60 may be formed on the top surface of the lower drain-side contact via structure 74A and on the sidewalls of the recess cavity 79 by depositing and patterning a dielectric material layer. The antifuse dielectric layer 60 may include any material that may be used for the antifuse dielectric layer 60 in any of the previously disclosed exemplary structures above.

Referring to FIG. 9D, a first-line-level dielectric layer 80 may be formed over the contact-level dielectric layer 70. Line cavities may be formed in the first-line-level dielectric layer 80, for example, by application and patterning of a photoresist layer (not shown) over the first-line-level dielectric layer 80 and by transferring the pattern in the photoresist layer through the first-line-level dielectric layer 80 by an anisotropic etch process. The anisotropic etch process may remove the portion of the dielectric material layer of the first-line-level dielectric layer 80 that fills a volume that is laterally surrounded by sidewalls of the antifuse dielectric layer 60. A recessed top surface and inner sidewalls of the antifuse dielectric layer 60 may be physically exposed at the bottom of each cavity that is laterally surrounded by the antifuse dielectric layer 60.

At least one conductive material (such as a metallic barrier liner and a metallic fill material) may be deposited in the line cavities in the first-line-level dielectric layer 80 and in the cavity laterally surrounded by the antifuse dielectric layer 60 to form various metal line structures, which include a first-line-level source-side line structure 82 contacting the source-side contact via structure 72, a first-line-level drain-side line structure 84 contacting the recessed horizontal surface and the inner sidewall of the antifuse dielectric layer 60, and a first-line-level gate connection line structure (not illustrated) contacting the gate contact via structure. The first-line-level drain-side line structure 84 includes a downward-protruding metal via portion that fills a cavity that is laterally surrounded by the antifuse dielectric layer 60. The downward-protruding metal via portion of the first-line-level drain-side line structure 84 is a metal via portion, which is also referred to as an upper contact-level metal via structure 74B.

Referring to FIG. 10A, a first embodiment of a tenth exemplary structure for forming a one time programmable memory device may be derived from the fifth exemplary structure of FIG. 5A by forming a combination of a lower first-via-level metal via structure 94A, an antifuse dielectric layer 60, and an upper first-via-level metal via structure 94B within a first-via-level dielectric layer 90 that includes a vertical stack of a lower first-via-level dielectric layer 90A and an upper first-via-level dielectric layer 90B.

Referring to FIG. 10B, a second embodiment of the tenth exemplary structure for forming a one time programmable memory device may be derived from the ninth exemplary structure by forming a combination of a lower first-via-level metal via structure 94A, an antifuse dielectric layer 60, and a second-line-level metal line structure 104 including a downward-protruding metal via portion that fills a recess cavity that is laterally surrounded by the antifuse dielectric layer 60. The downward-protruding metal via portion of the second-line-level metal line structure 104 is herein referred to as an upper first-via-level metal via structure 94B.

Figure 11A:
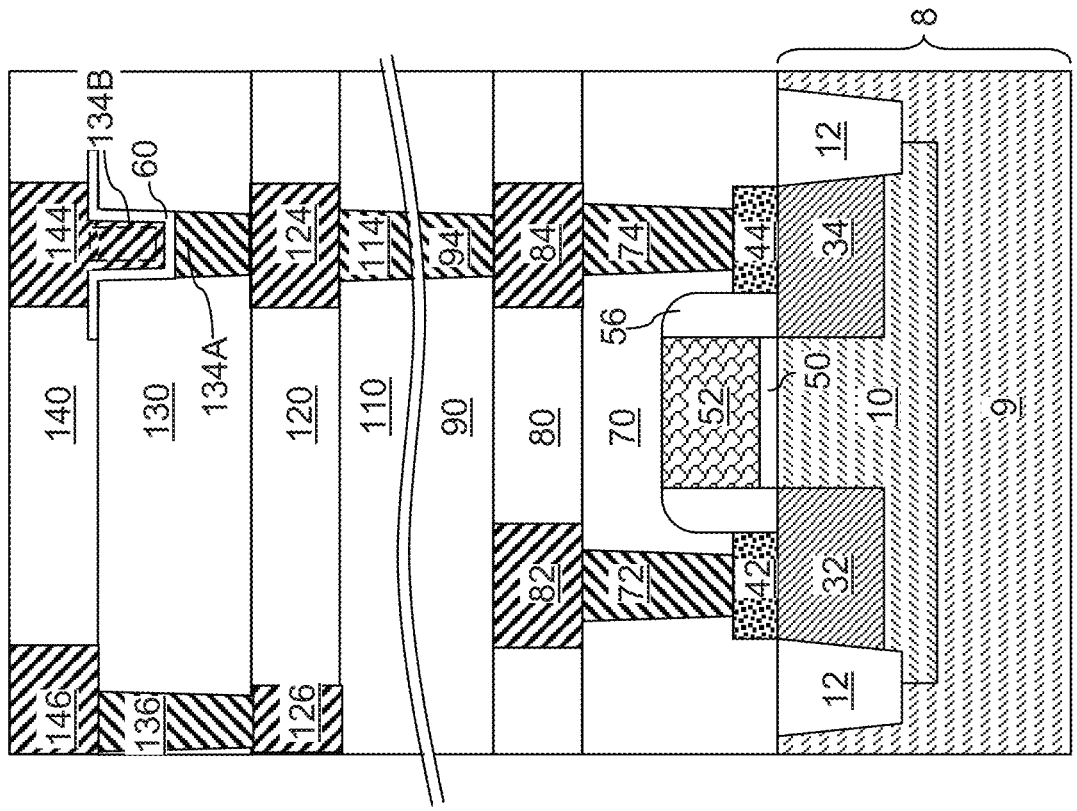
FIGS. 11A and 11B are vertical cross-sectional views of various embodiments of an eleventh exemplary structure including an OTP memory device according to an eleventh embodiment of the present disclosure.

Referring to FIG. 11A, a first embodiment of an eleventh exemplary structure for forming a one time programmable memory device may be derived from the first embodiment of the tenth exemplary structure by forming a combination of a lower N-th-via-level metal via structure 134A, an antifuse dielectric layer 60, and an upper N-th-via-level metal via structure 134B within an N-th-via-level dielectric layer 130 that includes a vertical stack of a lower N-th-via-level dielectric layer 130A and an upper N-th-via-level dielectric layer 130B. The processing steps of the eighth embodiment may be performed mutatis mutandis at the level of the N-th-via-level dielectric layer 130 to form the first embodiment of the eleventh exemplary structure. N may be a positive integer greater than 1.

Figure 11B:
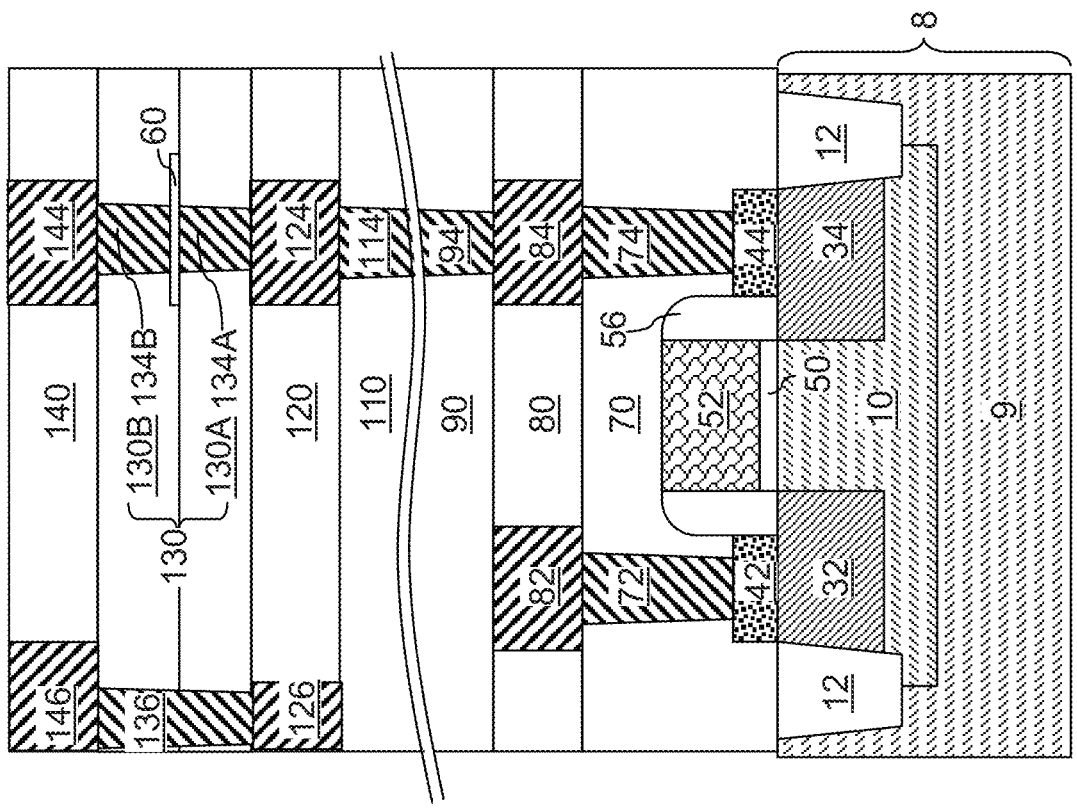

Referring to FIG. 11B, a second embodiment of the eleventh exemplary structure for forming a one time programmable memory device may be derived from the second embodiment of the tenth exemplary structure by forming a combination of a lower N-th-via-level metal via structure 13A, an antifuse dielectric layer 60, and an (N+1)-th-line-level metal line structure 144 including a downward-protruding metal via portion that fills a recess cavity that is laterally surrounded by the antifuse dielectric layer 60. The downward-protruding metal via portion of the (N+1)-th-line-level metal line structure 144 is herein referred to as an upper N-th-via-level metal via structure 134B. N may be a positive integer greater than 1.

Referring collectively to FIGS. 8A-11B, a one time programmable memory device may be provided by: forming a field effect transistor including a source region 32, a drain region 34, a gate dielectric 50, and a gate electrode 52 on a substrate 8; and by forming an antifuse structure {(74A, 60, 74B), (94A, 60, 94B), (134A, 60, 134B)} including a first node (74A, 94A, 134A), an antifuse dielectric layer 60, and a second node (74B, 94B, 134B) on, or over, the antifuse dielectric layer 60, wherein one, or both, of the first node (74A, 94A, 134A) and the second node (74B, 94B, 134B) comprise a metal via structure (74A, 94A, 134A, 74B, 94B, 134B) formed within a via cavity extending through an interlayer dielectric material layer (70, 90, 130) that overlies the field effect transistor.

In some embodiment, a recess cavity may be formed by vertically recessing a metal via structure (74, 94, 134). The antifuse dielectric layer 60 may be formed on the recessed top surface of the metal via structure (such as the lower drain-side contact via structure 74A, the lower first-via-level metal via structure 94A, or the lower N-th-via-level metal via structure 134A). Another metal via structure (such as the upper drain-side contact via structure 74B, the upper first-via-level metal via structure 94B, or the upper N-th-via-level metal via structure 134B in FIG. 8C, 10A, or 11A) or a metal via portion (such as the upper drain-side contact via structure 74B, the upper first-via-level metal via structure 94B, or the upper N-th-via-level metal via structure 134B in FIG. 9D, 10B, or 11B) of a metallic structure that includes a metal line structure (such as a first-line-level drain-side line structure 84, a second-line-level metal line structure 104, or an (N+1)-th-line-level metal line structure 144 in FIG. 9D, 10B, or 11B) in the recess cavity.

As such, the metal-insulator-metal (MIM) antifuse structure may include: a field effect transistor including a source region 32, a drain region 34, a gate dielectric 50, and a gate electrode 52 and located on a substrate 8; and a first node (74A, 94A, 134A) electrically connected to the drain region 34, a second node (74B, 94B, 134B) that is vertically spaced from the first node (74A, 94A, 134A), and an antifuse dielectric layer 60 located between the first node (74A, 94A, 134A) and the second node (74B, 94B, 134B), wherein one, or both, of the first node (74A, 94A, 134A) and the second node (74B, 94B, 134B) comprises a metal via structure (74A, 94A, 134A, 74B, 94B, 134B) that is laterally surrounded by an interlayer dielectric material layer (70, 90, 130) that overlies the substrate 8. Another of the first node (74A, 94A, 134A) and the second node (74B, 94B, 134B) comprises another metal via structure (such as the upper drain-side contact via structure 74B, the upper first-via-level metal via structure 94B, or the upper N-th-via-level metal via structure 134B in FIG. 8C, 10A, or 11A) or a metal via portion (such as the upper drain-side contact via structure 74B, the upper first-via-level metal via structure 94B, or the upper N-th-via-level metal via structure 134B in FIG. 9D, 10B, or 11B) of a metallic structure that includes a metal line structure (such as a first-line-level drain-side line structure 84, a second-line-level metal line structure 104, or an (N+1)-th-line-level metal line structure 144 in FIG. 9D, 10B, or 11B.

Figure 12B:
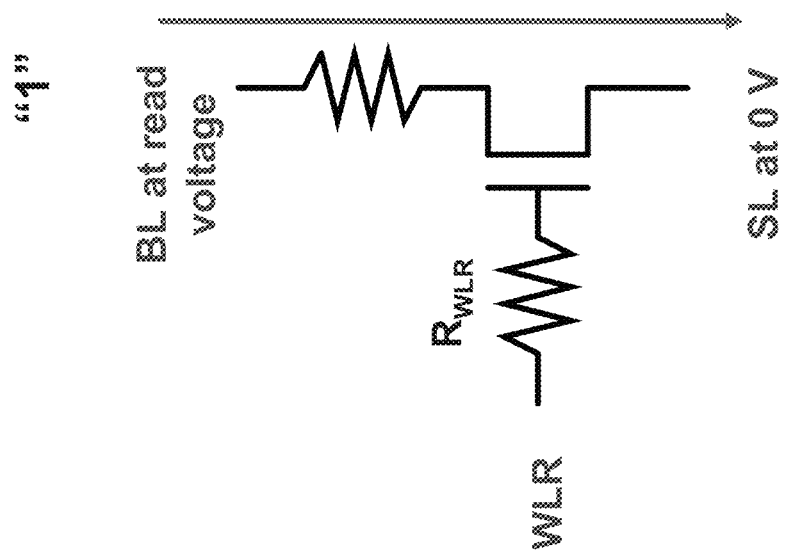
FIG. 12B is a circuit schematic of a programmed discrete OTP memory device according to an embodiment of the present disclosure.
Figure 12A:
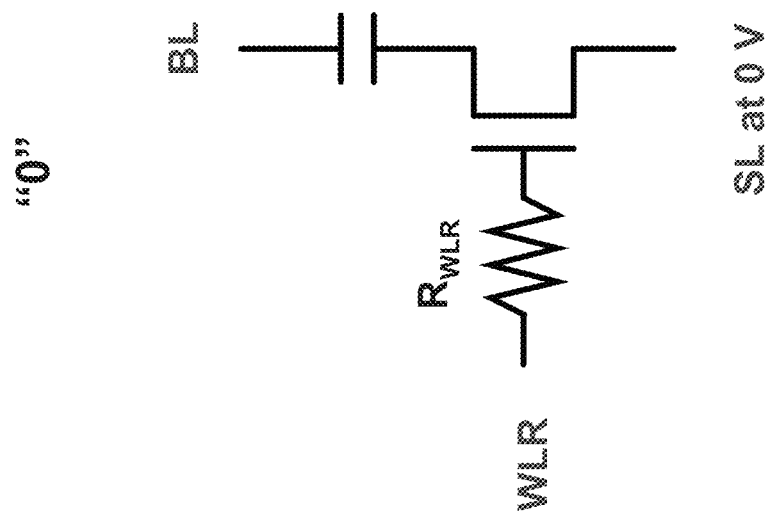
FIG. 12A is a circuit schematic of an unprogrammed discrete OTP memory device according to an embodiment of the present disclosure.

Referring to FIG. 12A, a circuit schematic of an unprogrammed discrete OTP memory device according to an embodiment of the present disclosure is illustrated. The source region 32 may be electrically connected to a source line SL, which may be electrically biased at 0 V during operation. The second node of the antifuse structure is connected to a bit line BL. The gate electrode 52 may be electrically connected to a word line WLR, which has a gate resistance $R_{WLR}$. The antifuse structure functions as a capacitor, through which direct current does not flow. The unprogrammed state of the antifuse may be logically equivalent to a "0" state.

Referring to FIG. 12B, a circuit schematic of a programmed discrete OTP memory device according to an embodiment of the present disclosure is illustrated. The source region 32 may be electrically connected to a source line SL, which may be electrically biased at 0 V during operation. The gate electrode 52 may be electrically connected to a word line WLR, which has a gate resistance $R_{WLR}$. The programmed antifuse structure functions as a resistor, through which direct current flows when the bit line BL is biased at a read voltage. The unprogrammed state of the antifuse may be logically equivalent to a "1" state.

Figure 13:
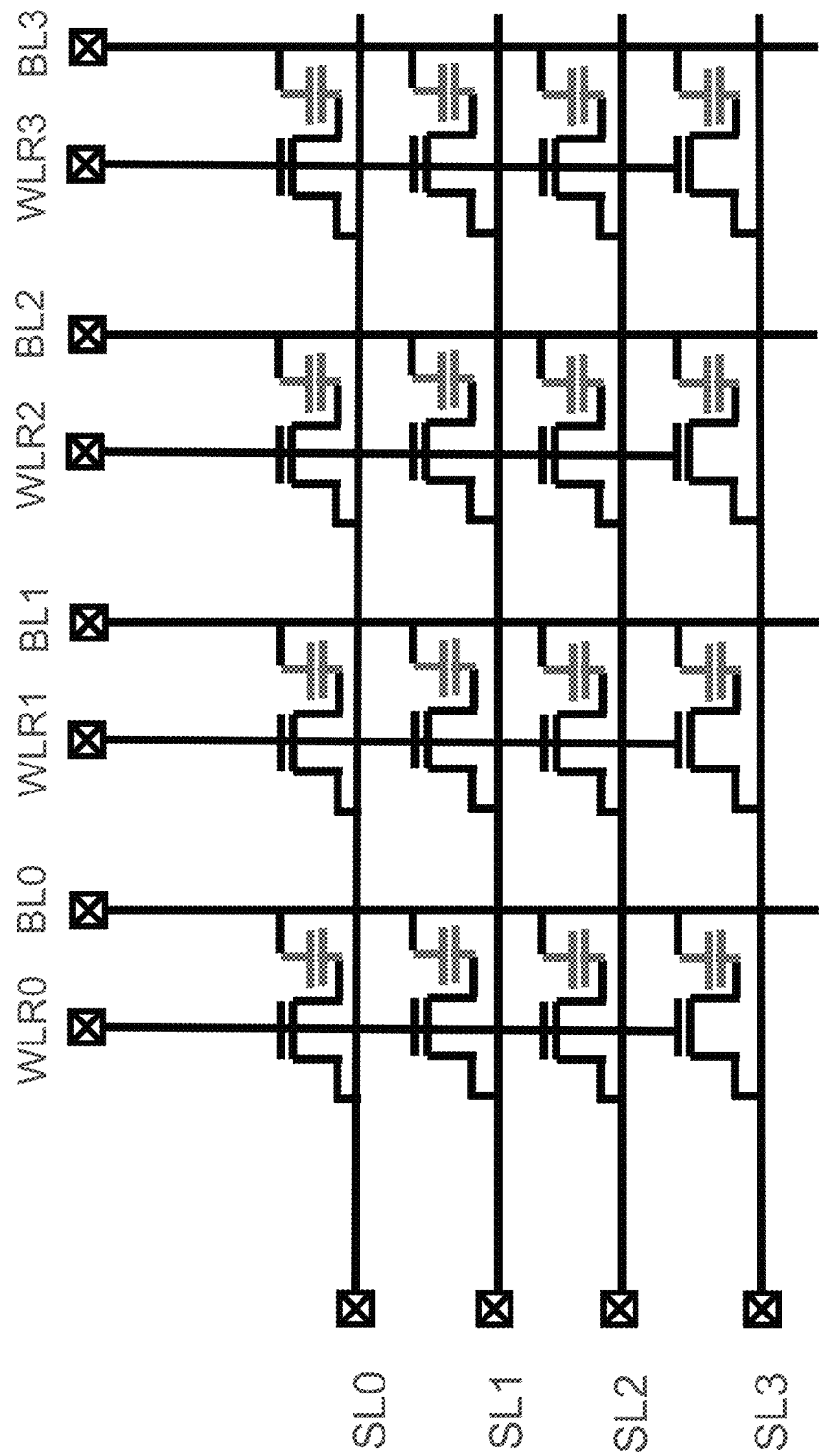
FIG. 13 is a circuit schematic of a two-dimensional array of OTP memory devices according to an embodiment of the present disclosure.

Referring to FIG. 13, a two-dimensional array of OTP memory devices according to an embodiment of the present disclosure is illustrated, which may be provided by forming multiple instances of any configuration of the OTP memory device of the present disclosure in a two-dimensional array configuration. Multiple source lines SLi, multiple word lines WLRj, and multiple bit lines BLk may be formed. The indices i, j, and k may be non-negative integers beginning with 0.

Figure 14:
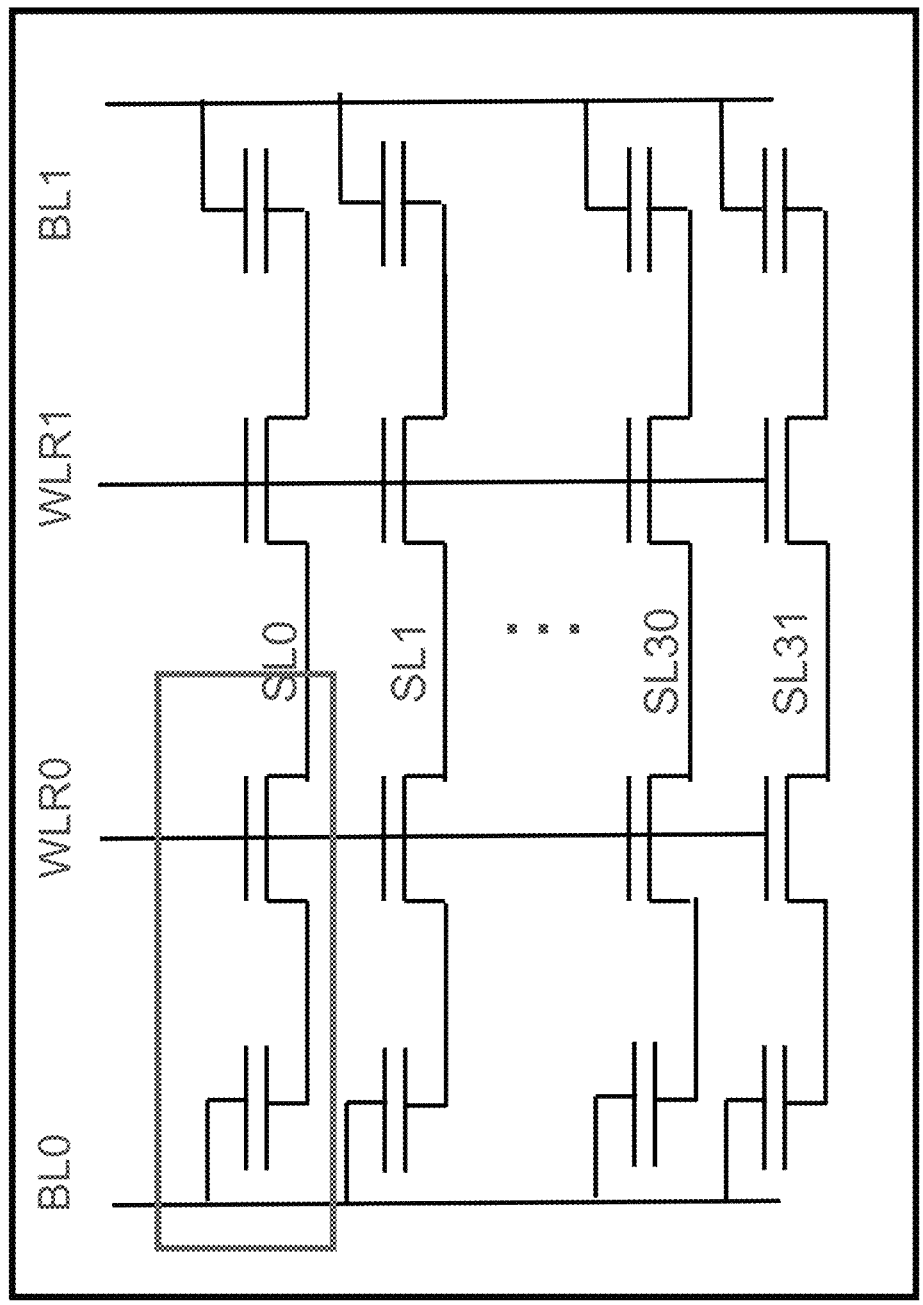
FIG. 14 is a circuit schematic of a 32×2 bit cell block in which each pair of OTP memory devices shares a respective source line according to an embodiment of the present disclosure.

Referring to FIG. 14, a circuit schematic of a 32×2 bit cell block is illustrated, in which each pair of OTP memory devices shares a respective source line SLi according to an embodiment of the present disclosure. Two word lines and two bit lines may be shared by a respective set of 32 memory cells.

Figure 15:
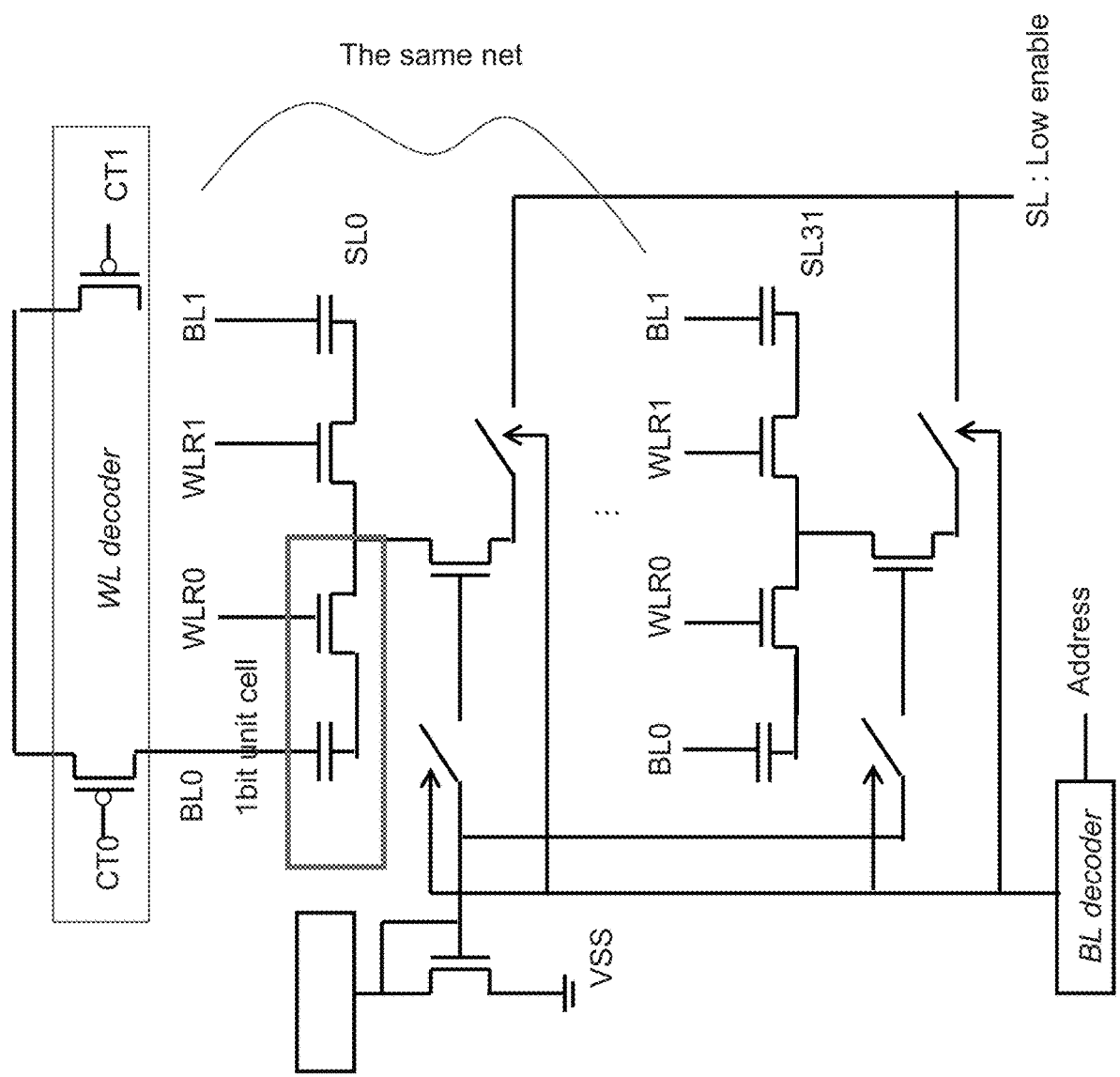
FIG. 15 is another circuit schematic of the 32×2 bit cell block of FIG. 14 in which control switches are expressly illustrated according to an embodiment of the present disclosure.

Referring to FIG. 15, various peripheral devices may be provided for the 32×2 bit cell block illustrated in FIG. 14. For example, a bit decoder, a source-side power supply circuit, and a bit-line-side power supply transistor (such as CT0 and CT1) may be used.

While FIGS. 13-15 illustrate exemplary memory arrays that may be formed using a two-dimensional array of OTP memory devices of the present disclosure, it is understood that an array of OTP memory devices of the present disclosure may be formed in any array configuration known in the art.

Figure 16:
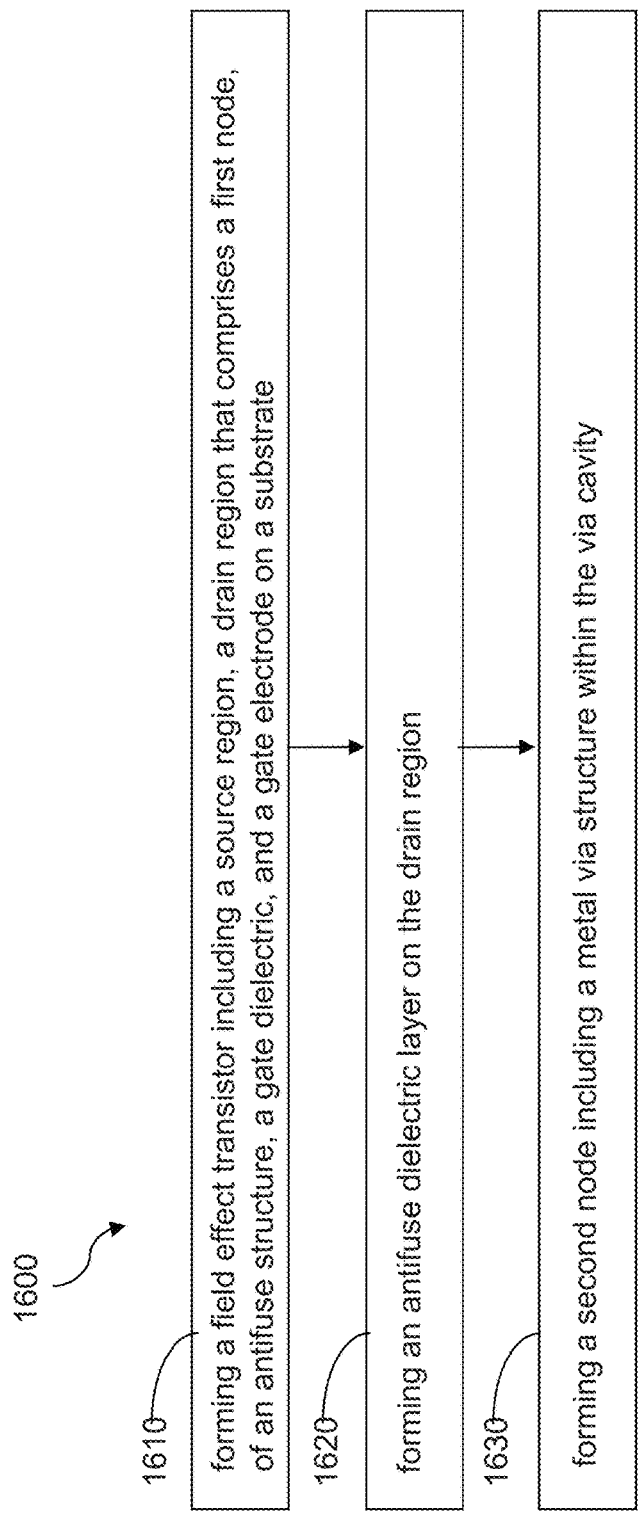
FIG. 16 is a first flow chart illustrating a set of processing steps for forming an OTP memory device according to an embodiment of the present disclosure.

Referring to FIG. 16, a first flow chart 1600 illustrates a set of processing steps for forming an OTP memory device according to an embodiment of the present disclosure. Referring to step 1610, a field effect transistor including a source region 32, a drain region 34 that comprises a first node of an antifuse structure, a gate dielectric 50, and a gate electrode 52 may be formed on a substrate 8. Referring to step 1620, an antifuse dielectric layer 60 may be formed on the drain region 34. Referring to step 1630, a second node including a metallic material portion (such as a drain-side metallic material portion 44) may be formed on the antifuse dielectric layer 60. The embodiments of the first exemplary structure of FIGS. 1D-1G may be formed by this method.

Figure 17:
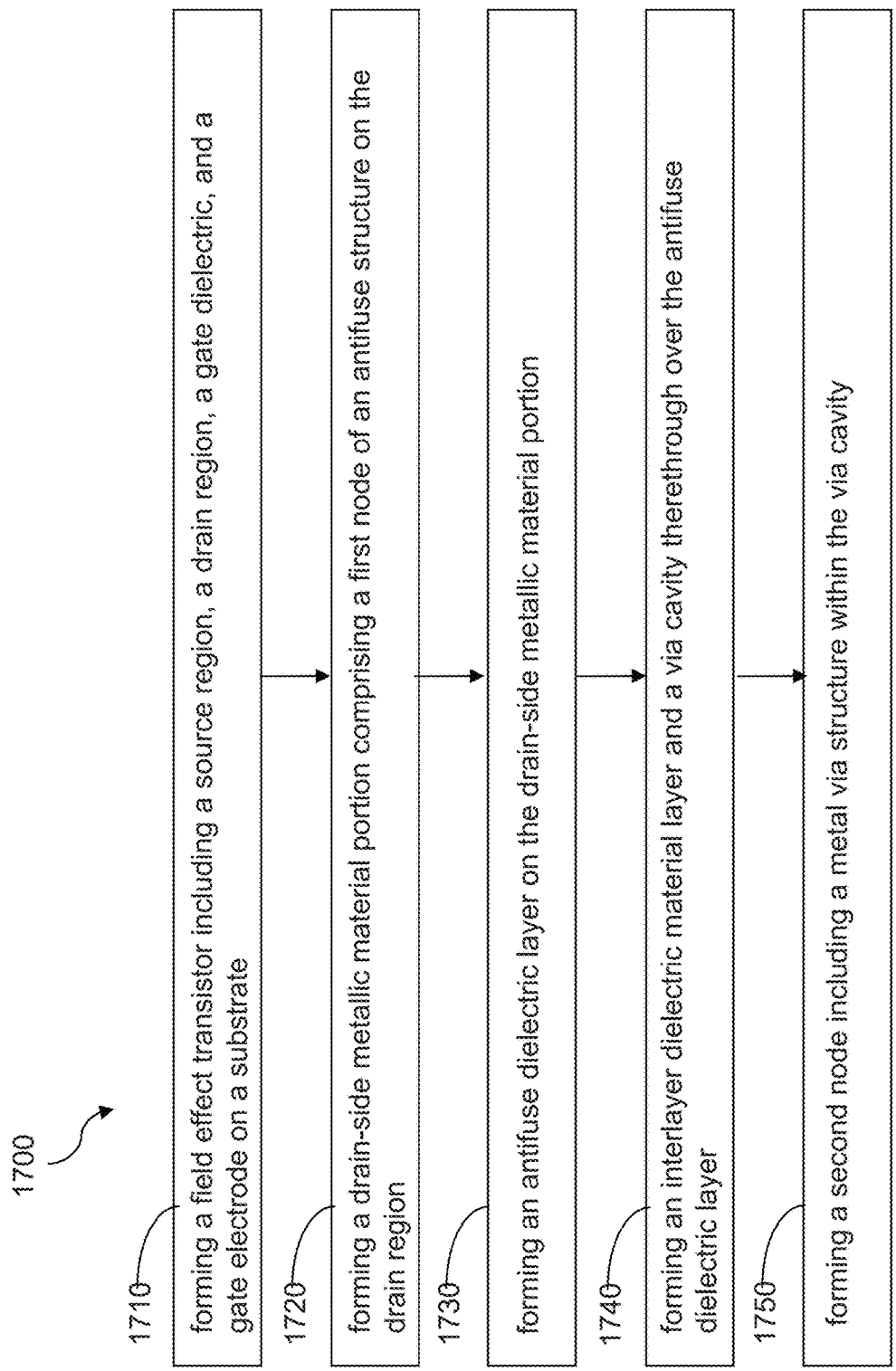
FIG. 17 is a second flow chart illustrating a set of processing steps for forming an OTP memory device according to an embodiment of the present disclosure.

Referring to FIG. 17, a second flow chart 1700 illustrates a set of processing steps for forming an OTP memory device according to an embodiment of the present disclosure. Referring to step 1710, a field effect transistor including a source region 32, a drain region 34, a gate dielectric 50, and a gate electrode 52 may be formed on a substrate 8. Referring to step 1720, a drain-side metallic material portion 44 comprising a first node of an antifuse structure may be formed on the drain region 34. Referring to step 1730, an antifuse dielectric layer 60 may be formed on the drain-side metallic material portion 44. Referring to step 1740, an interlayer dielectric material layer (such as a contact-level dielectric layer 70) and a via cavity therethrough may be formed over the antifuse dielectric layer 60. Referring to step 1750, a second node including a metal via structure (such as a drain-side contact via structure 74) may be formed within the via cavity. The second exemplary structure of FIGS. 2D-2G may be formed by this method.

Figure 18:
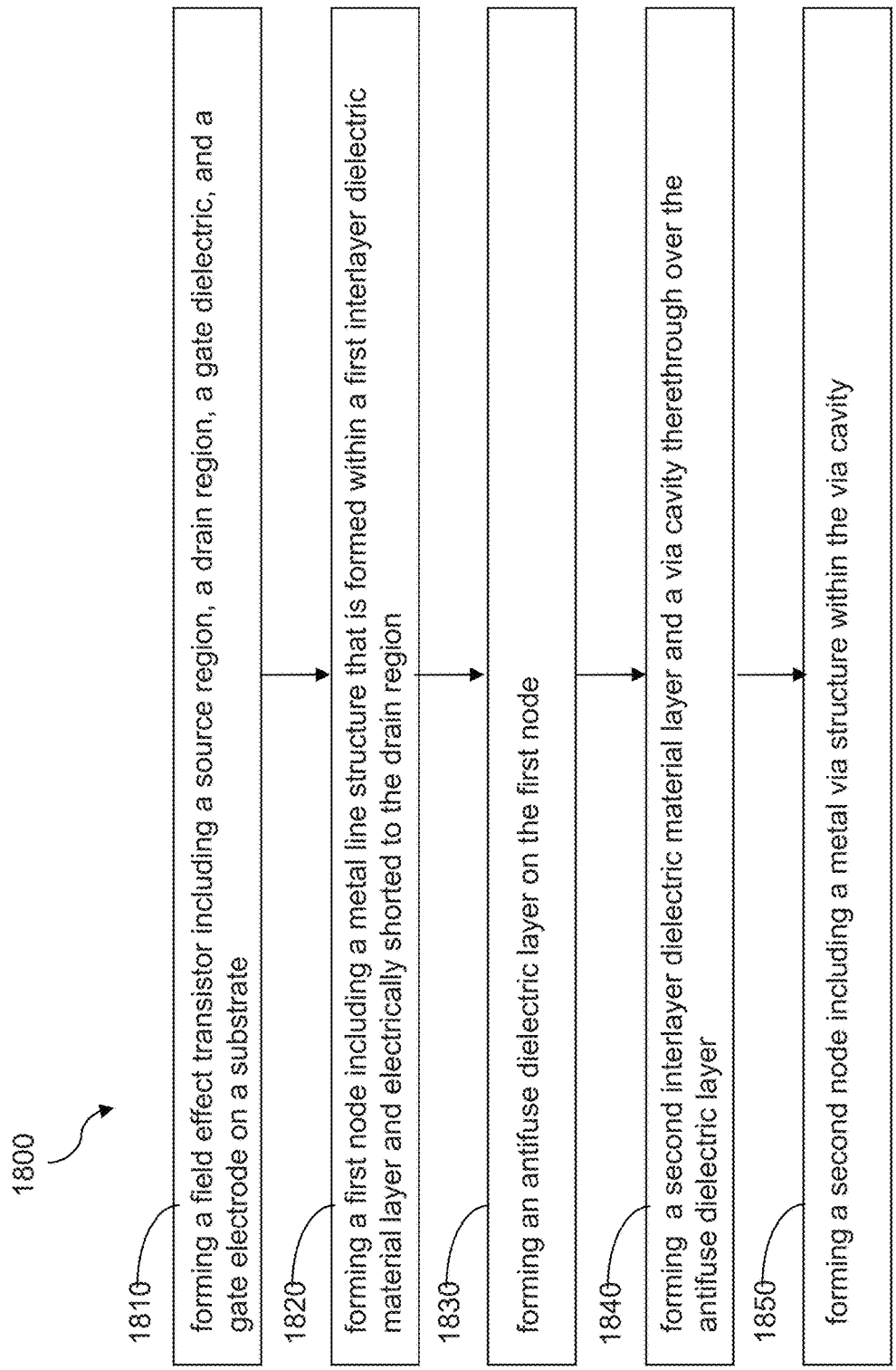
FIG. 18 is a third flow chart illustrating a set of processing steps for forming an OTP memory device according to an embodiment of the present disclosure.

Referring to FIG. 18, a third flow chart 1800 illustrates a set of processing steps for forming an OTP memory device according to an embodiment of the present disclosure. Referring to step 1810, a field effect transistor including a source region 32, a drain region 34, a gate dielectric 50, and a gate electrode 52 may be formed on a substrate 8. Referring to step 1820, a first node including a metal line structure (84, 124) that is formed in a first interlayer dielectric material layer (80, 120) and electrically connected to the drain region 34 may be formed. Referring to step 1830, an antifuse dielectric layer 60 may be formed on the first node. Referring to step 1840, a second interlayer dielectric material layer (90, 130) and a via cavity therethrough may be formed over the antifuse dielectric layer 60. Referring to step 1850, a second node including a metal via structure (94, 134) may be formed within the via cavity. The fourth exemplary structures of FIGS. 4A-4D and the sixth exemplary structure of FIG. 6 may be formed by this method.

Figure 19:
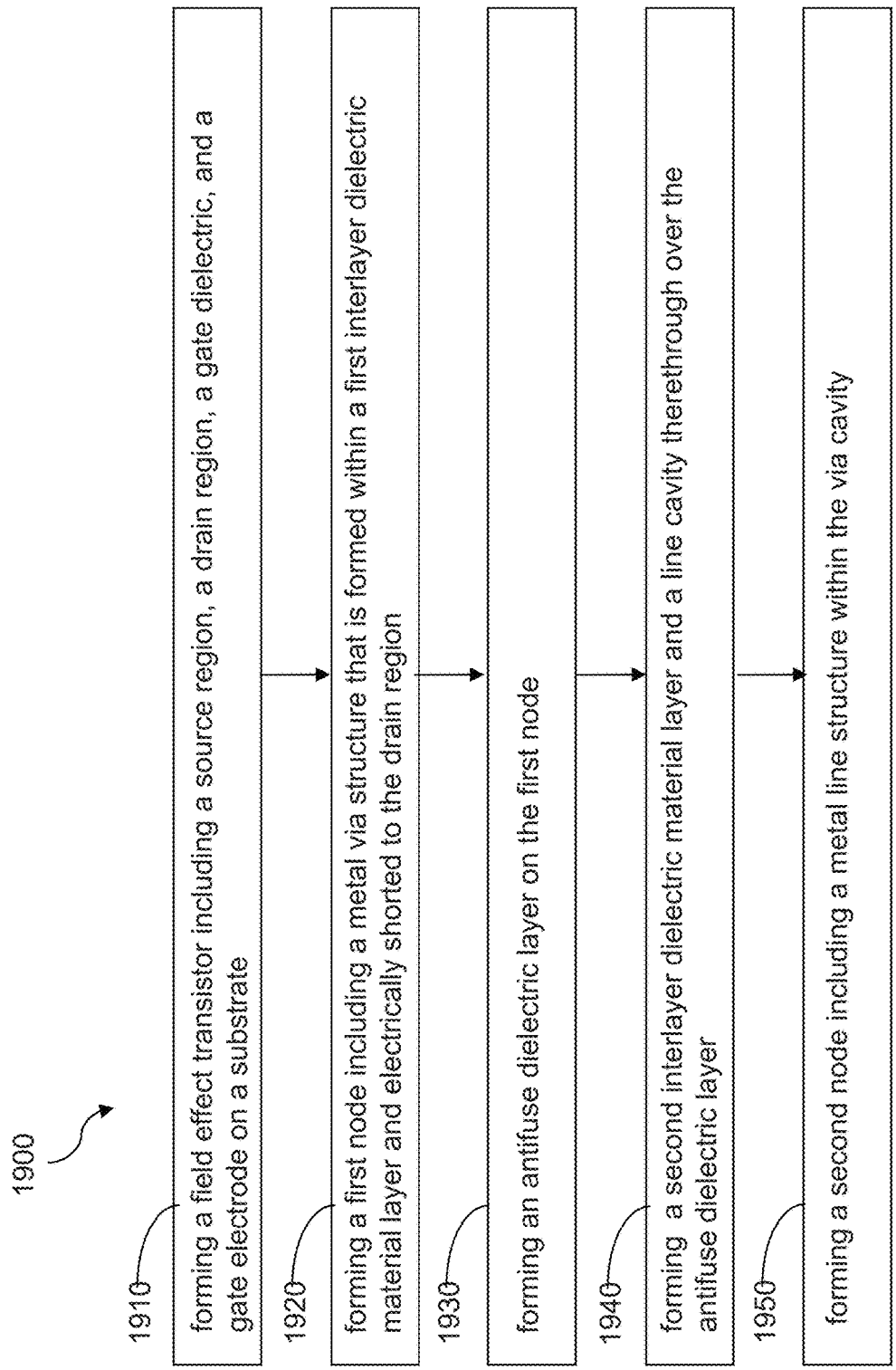
FIG. 19 is a fourth flow chart illustrating a set of processing steps for forming an OTP memory device according to an embodiment of the present disclosure.

Referring to FIG. 19, a fourth flow chart 1900 illustrates a set of processing steps for forming an OTP memory device according to an embodiment of the present disclosure. Referring to step 1910, a field effect transistor including a source region 32, a drain region 34, a gate dielectric 50, and a gate electrode 52 may be formed on a substrate 8. Referring to step 1920, a first node including a metal via structure (74, 94, 134) that is formed in a first interlayer dielectric material layer (70, 90, 130) and electrically connected to the drain region 34 is formed. Referring to step 1930, an antifuse dielectric layer 60 may be formed on the first node. Referring to step 1940, a second interlayer dielectric material layer (80, 100, 140) and a line cavity therethrough may be formed over the antifuse dielectric layer 60. Referring to step 1950, a second node including a metal line structure (84, 104, 144) may be formed within the via cavity. The third exemplary structures of FIGS. 3A-3E, the fifth exemplary structures of FIGS. 5A and 5B, and the seventh exemplary structures of FIGS. 7A and 7B may be formed by this method.

Figure 20:
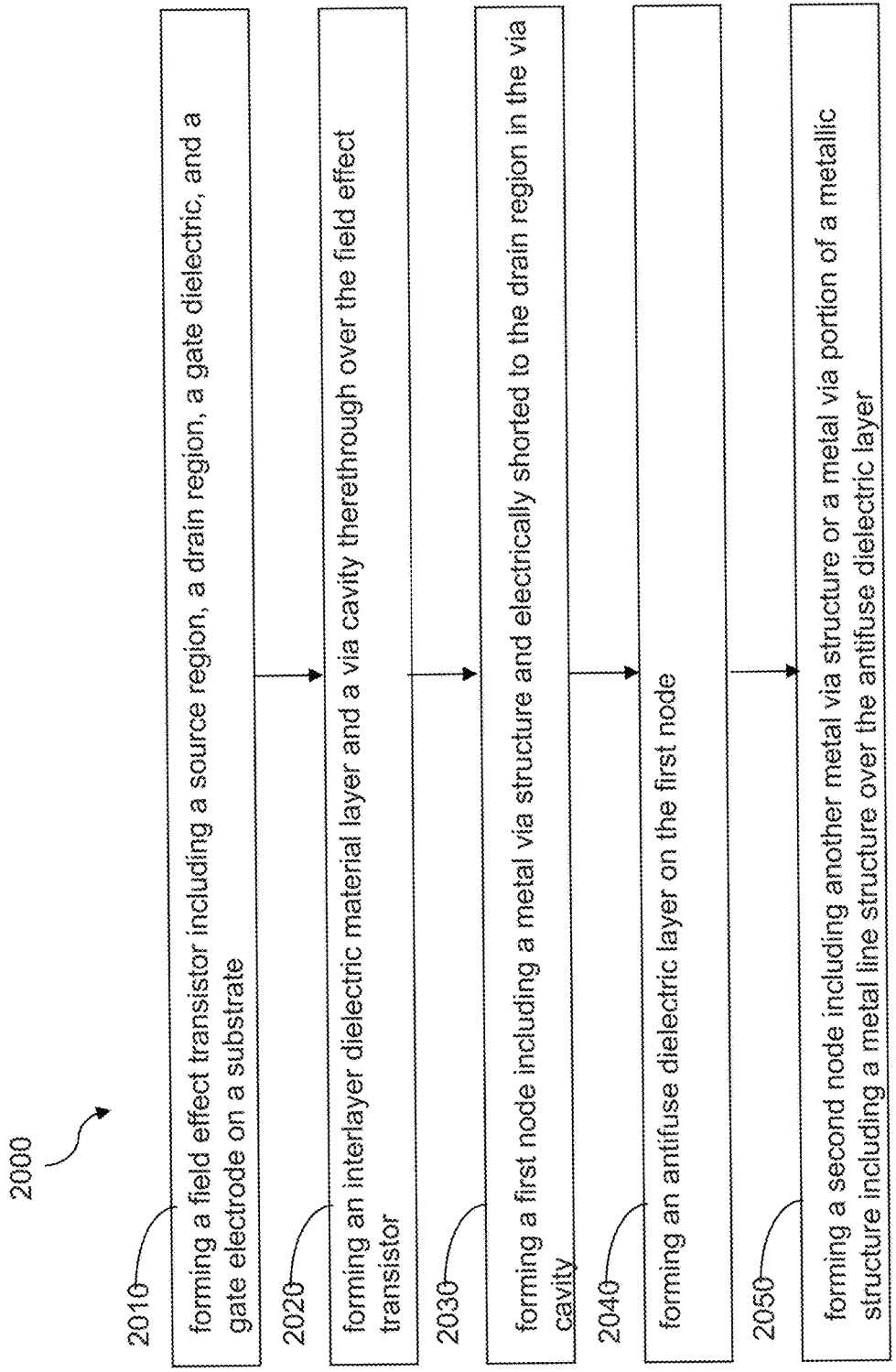
FIG. 20 is a fifth flow chart illustrating a set of processing steps for forming an OTP memory device according to an embodiment of the present disclosure.
Figure 21:
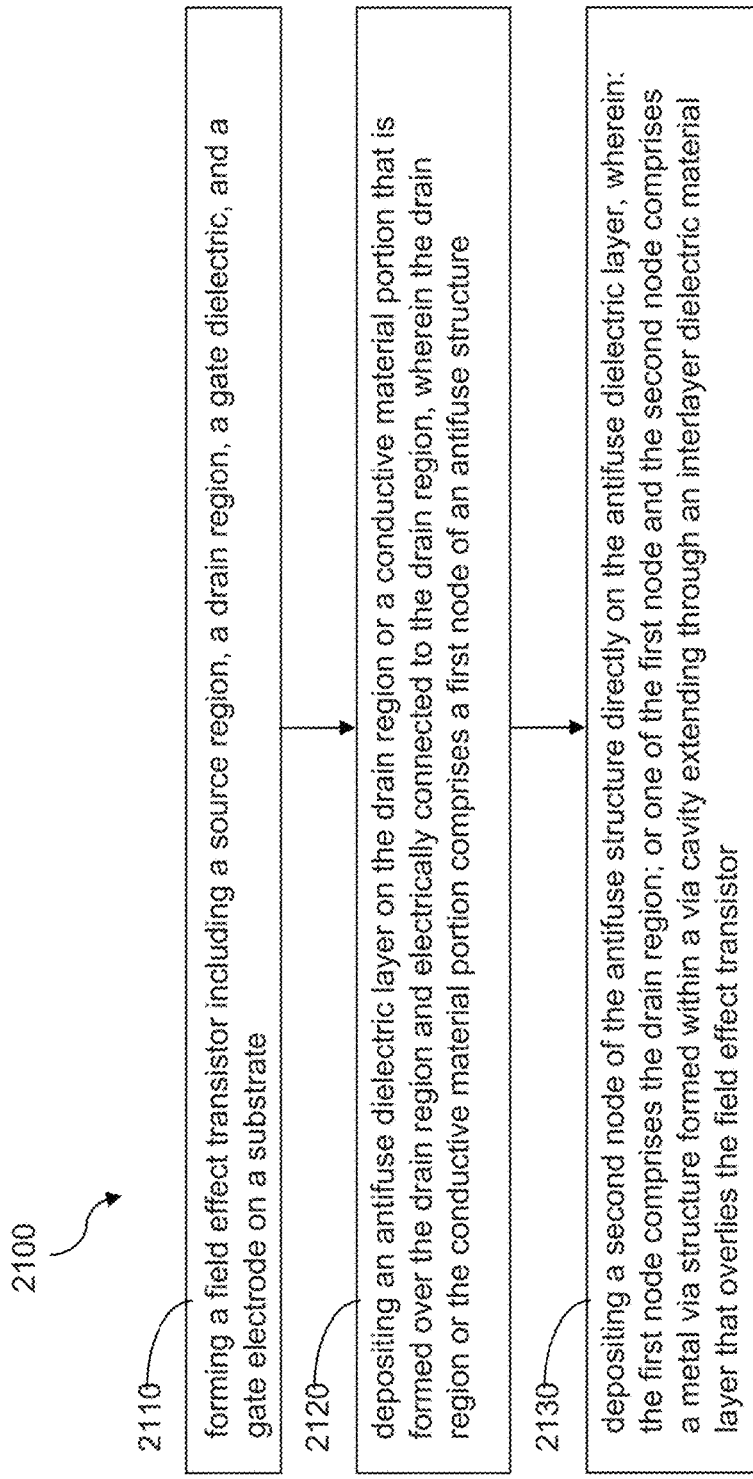
FIG. 21 is a sixth flow chart illustrating a set of processing steps for forming an OTP memory device according to an embodiment of the present disclosure.

Referring to FIG. 20, a fifth flow chart 2000 illustrates a set of processing steps for forming an OTP memory device according to an embodiment of the present disclosure. Referring to step 2010, a field effect transistor including a source region 32, a drain region 34, a gate dielectric 50, and a gate electrode 52 may be formed on a substrate 8. Referring to step 2020, an interlayer dielectric material layer (70, 90, 130) and a via cavity therethrough may be formed over the field effect transistor. Referring to step 2030, a first node including a metal via structure (74A, 94A, 134A) and electrically connected to the drain region 34 may be formed in the via cavity. Referring to step 2040, an antifuse dielectric layer 60 may be formed on the first node. Referring to step 2050, a second node including another metal via structure (such as the upper drain-side contact via structure 74B, the upper first-via-level metal via structure 94B, or the upper N-th-via-level metal via structure 134B in FIG. 8C, 10A, or 11A) or a metal via portion (such as the upper drain-side contact via structure 74B, the upper first-via-level metal via structure 94B, or the upper N-th-via-level metal via structure 134B in FIG. 9D, 10B, or 11B) of a metallic structure including a metal line structure (such as a first-line-level drain-side line structure 84, a second-line-level metal line structure 104, or an (N+1)-th-line-level metal line structure 144 in FIG. 9D, 10B, or 11B) over the antifuse dielectric layer 60. The eighth exemplary structure of FIG. 8C, the ninth exemplary structure of FIG. 9D, the tenth exemplary structures of FIGS. 10A and 10B, and the eleventh exemplary structures of FIGS. 11A and 11B may be formed by this method Referring to FIG. 21, a sixth flow chart 2100 illustrates a set of processing steps for forming an OTP memory device, which may be used to form any of the OTP memory devices of the present disclosure. Referring to step 2110, a field effect transistor including a source region 32, a drain region 34, a gate dielectric 50, and a gate electrode 52 is formed on a substrate 8. Referring to step 2120, an antifuse dielectric layer 60 may be deposited on the drain region 34 or a conductive material portion (44, 84, 124, 74, 94, 134, 74A, 94A, 134A) that is formed over the drain region 34 and electrically connected to the drain region 34. The drain region 34 or the conductive material portion (44, 84, 124, 74, 94, 134, 74A, 94A, 134A) comprises a first node of an antifuse structure. Referring to step 2130, a second node (44, 84, 104, 144, 74, 94, 134, 74B, 94B, 134B) of the antifuse structure is formed directly on the antifuse dielectric layer 60. The first node comprises the drain region 34, or one of the first node (34, 44, 84, 124, 74, 94, 134, 74A, 94A, 134A) and the second node (44, 84, 104, 144, 74, 94, 134, 74B, 94B, 134B) comprises a metal via structure (74, 94, 134, 74A, 94A, 134A, 74B, 94B, 134B) formed within a via cavity extending through an interlayer dielectric material layer (70, 90, 130) that overlies the field effect transistor.

The various embodiments of the present disclosure provide an OTP memory device including an antifuse structure that is formed in middle-end-of-line (MEOL) level or back-end-of-line (BEOL) level. Selection of an OTP memory device within an array of OTP memory devices may be effected by a respective field effect transistor. Because the antifuse structure is formed in the MEOL level or in the BEOL level, the front-end-of-line (FEOL) processes are not affected by integration of the OTP memory device into a semiconductor processing sequence. Thus, gate resistance effect may be avoided, an lower programming voltages may be used, which may be in a range from 4 V to 30 V. Thus, program disturb immunity among adjacent OTP memory devices may be reduced, and read voltage may be lowered and read process window may be expanded. The OTP memory device of the present disclosure may thus facilitate scaling of the memory device through reduction of device dimensions. The smallest bit-cell size and better read window may be provided.

According to an embodiment of the present disclosure, an one time programmable (OTP) memory device may be provided, where the OTP memory device includes a field effect transistor. The field effect transistor including a source region, a drain region, a gate dielectric, and a gate electrode and located on a substrate. The OTP memory device further including a semiconductor-insulator-metal (SIM) antifuse structure, where the SIM antifuse structure includes the drain region that constitutes a first node, a drain-side metallic material portion that constitutes a second node that is spaced from the first node, and an antifuse dielectric layer located between the first node and the second node.

According to another embodiment of the present disclosure, an one time programmable (OTP) memory device may be provided, where the OTP memory device includes a field effect transistor. The field effect a source region, a drain region, a gate dielectric, and a gate electrode and located on a substrate. The OTP memory device further including a metal-insulator-metal (MIM) antifuse structure, where the MIM antifuse structure includes a first node electrically connected to the drain region, a second node that is vertically spaced from the first node, and an antifuse dielectric layer located between the first node and the second node, wherein one of the first node and the second node comprises a metal via structure that is laterally surrounded by an interlayer dielectric material layer that overlies the substrate.

According to another embodiment of the present disclosure, a method of forming a one time programmable memory device is provided, wherein the method includes the operations of: forming a field effect transistor including a source region, a drain region, a gate dielectric, and a gate electrode on a substrate; and forming an antifuse structure including a first node, an antifuse dielectric layer, and a second node on, or over, the antifuse dielectric layer, wherein one of the first node and the second node comprises the drain region or a metal via structure formed within a via cavity extending through an interlayer dielectric material layer that overlies the field effect transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one time programmable (OTP) memory device comprising:
    a field effect transistor including a source region, a drain region, a body region, a gate dielectric, a dielectric gate spacer, and a gate electrode and located on a substrate, wherein the dielectric gate spacer laterally surrounds the gate electrode, and a shallow trench isolation structure laterally surrounds the source region, the drain region, and the body region;
    a semiconductor-insulator-metal (SIM) antifuse structure including the drain region that constitutes a first node, a drain-side metallic material portion that constitutes a second node that is spaced from the first node and is in direct contact with a first sidewall of the dielectric gate spacer, and a dielectric structure comprising an antifuse dielectric layer, the dielectric structure located between the first node and the second node and contacting the first sidewall of the dielectric gate spacer, a top surface of the drain region and a top surface of the shallow trench isolation structure;
    a source-side metallic material portion contacting a top surface of the source region and a second sidewall of the dielectric gate spacer, wherein the source-side metallic material portion and the drain-side metallic material portion have a same material composition throughout, the same material composition containing a material selected from a metal-semiconductor alloy material and at least one conductive metallic nitride material, and an entirety of an interface between the antifuse dielectric layer and the drain-side metallic material portion is an interface between a dielectric material of the antifuse dielectric layer and a material portion having the same material composition;
    a contact-level dielectric layer comprising a dielectric material overlying the gate electrode, contacting a peripheral portion of a top surface of the drain-side metallic material portion, contacting a peripheral portion of a top surface of the source-side metallic material portion;
    a drain-side contact via structure comprising a bottom surface contacting a center portion of the top surface of the drain-side metallic material portion below a horizontal plane including a top surface of the gate electrode and having a top surface located above the horizontal plane including a top surface of the gate electrode; and
    a source-side contact via structure comprising a bottom surface contacting a center portion of the top surface of the drain-side metallic material portion below the horizontal plane including the top surface of the gate electrode and having a top surface located above the horizontal plane including the top surface of the gate electrode.

2. The OTP memory device of claim 1, wherein the contact-level dielectric layer is in direct contact with a sidewall of the drain-side metallic material portion and with a sidewall of the drain-side contact via structure.

3. The OTP memory device of claim 2, wherein:
    the drain-side metallic material portion has a greater lateral extent than the drain-side contact via structure; and
    the contact-level dielectric layer laterally surrounds the gate electrode; and
    the drain-side contact via structure has a top surface within a same horizontal plane as a top surface of the contact-level dielectric layer.

4. The OTP memory device of claim 1, wherein the antifuse dielectric layer has a lateral extent that is greater than, or the same as, a lateral extent of the drain-side metallic material portion.

5. The OTP memory device of claim 1, wherein the antifuse dielectric layer has a lateral extent that is less than a lateral extent of the drain-side metallic material portion.

6. The OTP memory device of claim 1, wherein the dielectric structure comprises the an etch stop dielectric layer located on a top surface of the drain region.

7. The OTP memory device of claim 6, wherein the antifuse dielectric layer comprises:
    a planar portion overlying a top surface of the etch stop dielectric layer; and
    a downward protruding portion located within an opening in the etch stop dielectric layer and adjoined to a bottom end of the planar portion.

8. The OTP memory device of claim 6, wherein sidewalls of the antifuse dielectric layer are laterally offset inward from outer sidewalls of the etch stop dielectric layer such that the antifuse dielectric layer has a lesser area than an area enclosed by the outer sidewalls of the etch stop dielectric layer.

9. The OTP memory device of claim 8, wherein the sidewalls of the antifuse dielectric layer are laterally offset outward from inner sidewalls of the etch stop dielectric layer that defines the opening in the etch stop dielectric layer such that the antifuse dielectric layer has a greater area than an area enclosed by the inner sidewalls of the etch stop dielectric layer.

10. The OTP memory device of claim 6, wherein the etch stop dielectric layer comprises a material having a higher dielectric breakdown electrical field strength than a material of the antifuse dielectric layer.

11. The OTP memory device of claim 10, wherein:
    the etch stop dielectric layer comprises a dielectric metal oxide material; and
    the antifuse dielectric layer comprises silicon oxide.

12. The OTP memory device of claim 6, wherein: the etch stop dielectric layer contacts the first sidewall of the dielectric gate spacer; and the antifuse dielectric layer does not contact, and is laterally spaced from, the dielectric gate spacer.

13. The OTP memory device of claim 6, wherein the shallow trench isolation structure is located within the substrate and contacting a sidewall of the drain region, wherein the drain-side metallic material portion is in contact with a segment of the top surface of the shallow trench isolation structure.

14. The OTP memory device of claim 13, wherein the etch stop dielectric layer is in contact with a second segment of the top surface of the shallow trench isolation structure.

15. The OTP memory device of claim 6, wherein an entirety of the source-side metallic material portion and a portion of the drain-side metallic material portion overlying a horizontal top surface of the antifuse dielectric layer have a same thickness along a vertical direction that is perpendicular to a horizontal plane including a top surface of the substrate.

16. A one time programmable (OTP) memory device comprising:

a field effect transistor including a source region, a drain region, a body region, a gate dielectric, a dielectric gate spacer, and a gate electrode and located on a substrate, wherein the dielectric gate spacer laterally surrounds the gate electrode, and a shallow trench isolation structure laterally surrounds the source region, the drain region, and the body region;

a semiconductor-insulator-metal (SIM) antifuse structure including the drain region that constitutes a first node, a drain-side metallic material portion that constitutes a second node that is spaced from the first node and is in direct contact with a first sidewall of the dielectric gate spacer, an etch stop dielectric layer located between the first node and the second node on a top surface of the drain region and contacting the first sidewall of the dielectric gate spacer and a top surface of the shallow trench isolation structure, and an antifuse dielectric layer comprising a portion located within an opening in the etch stop dielectric layer and contacting the first node and the second node; and a source-side metallic material portion contacting a top surface of the source region and a second sidewall of the dielectric gate spacer, wherein the source-side metallic material portion and the drain-side metallic material portion have a same material composition throughout, the same material composition containing a material selected from a metal-semiconductor alloy material and at least one conductive metallic nitride material, and an entirety of an interface between the antifuse dielectric layer and the drain-side metallic material portion is an interface between a dielectric material of the antifuse dielectric layer and a material portion having the same material composition.

17. The OTP memory device of claim 16, wherein the antifuse dielectric layer comprises a planar portion overlying a top surface of the etch stop dielectric layer.

18. The OTP memory device of claim 16, wherein sidewalls of the antifuse dielectric layer are laterally offset inward from outer sidewalls of the etch stop dielectric layer such that the antifuse dielectric layer has a lesser area than an area enclosed by the outer sidewalls of the etch stop dielectric layer.

19. The OTP memory device of claim 16, wherein the etch stop dielectric layer comprises a material having a higher dielectric breakdown electrical field strength than a material of the antifuse dielectric layer.

20. A one time programmable (OTP) memory device comprising:

a field effect transistor including a source region, a drain region, a body region, a gate dielectric, a dielectric gate spacer, and a gate electrode and located on a substrate, wherein the dielectric gate spacer laterally surrounds the gate electrode, and a shallow trench isolation structure laterally surrounds the source region, the drain region, and the body region;

an etch stop dielectric layer located on a top surface of the drain region and contacting the first sidewall of the dielectric gate spacer and a top surface of the shallow trench isolation structure;

an antifuse dielectric layer comprising a portion located within an opening in the etch stop dielectric layer;

a drain-side metallic material portion contacting a top surface of the etch stop dielectric layer and contacting a top surface of the antifuse dielectric layer and is in direct contact with a first sidewall of the dielectric gate spacer the etchstop dielectric and the antifuse dielectric layer being located between the drain region and the drain-side metallic material portion; and a source-side metallic material portion contacting a top surface of the source region and a second sidewall of the dielectric gate spacer, wherein the source-side metallic material portion and the drain-side metallic material portion have a same material composition throughout, the same material composition containing a material selected from a metal-semiconductor alloy material and at least one conductive metallic nitride material, and an entirety of an interface between the antifuse dielectric layer and the drain-side metallic material portion is an interface between a dielectric material of the antifuse dielectric layer and a material portion having the same material composition.

* * * * *